United States Patent
Yokogawa et al.

(10) Patent No.: US 7,582,351 B2
(45) Date of Patent: Sep. 1, 2009

(54) COMPOSITE THIN FILM HOLDING SUBSTRATE, TRANSPARENT CONDUCTIVE FILM HOLDING SUBSTRATE, AND PANEL LIGHT EMITTING BODY

(75) Inventors: Hiroshi Yokogawa, Osaka (JP); Masaru Yokoyama, Osaka (JP); Kenji Kawano, Osaka (JP); Norihiro Itou, Osaka (JP); Koichi Takahama, Osaka (JP); Takeyuki Yamaki, Osaka (JP); Akira Tsujimoto, Osaka (JP); Yasuhisa Kishigami, Osaka (JP); Nobuhiro Ide, Osaka (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 644 days.

(21) Appl. No.: 10/492,534

(22) PCT Filed: Oct. 24, 2002

(86) PCT No.: PCT/JP02/11023

§ 371 (c)(1),
(2), (4) Date: Apr. 23, 2004

(87) PCT Pub. No.: WO03/035389

PCT Pub. Date: May 1, 2003

(65) Prior Publication Data

US 2004/0253427 A1  Dec. 16, 2004

(30) Foreign Application Priority Data

Oct. 25, 2001 (JP) ............... 2001-327878
Oct. 25, 2001 (JP) ............... 2001-327879

(51) Int. Cl.
*B32B 7/02* (2006.01)
*B32B 5/16* (2006.01)
*H05B 33/12* (2006.01)

(52) U.S. Cl. .............. 428/212; 428/323; 428/336; 428/447; 428/690; 313/506

(58) Field of Classification Search .............. 428/212, 428/323, 690, 917, 447, 336; 313/506, 504
See application file for complete search history.

(56) References Cited

U.S. PATENT DOCUMENTS 3,966,668 A  6/1976 Cain ..................... 523/340

(Continued)

FOREIGN PATENT DOCUMENTS

DE  44 18 214 A1  11/1995

(Continued)

OTHER PUBLICATIONS

Applied Physics Letters, vol. 78, No. 13, pp. 1927-1929. Applicants note that this document is mentioned on p. 8 of the specification of the present application.

(Continued)

*Primary Examiner*—D. Lawrence Tarazano
*Assistant Examiner*—Camie S Thompson
(74) *Attorney, Agent, or Firm*—Greenblum & Bernstein, P.L.C.

(57) ABSTRACT

There is provided a composite thin film-holding substrate in which a composite thin film (4) comprising a filler (2) having a refractive index lower than that of a substrate (1) and a binder (3) having a refractive index higher than that of the filler (2) is formed on a surface of the substrate (1). Light is efficiently scattered when passing through the composite thin film (3) which comprises the filler (2) and the binder (3) having different refractive indexes from each other. In addition, the refractive index of a composite thin film (4) comprising a filler (2) having a low refractive index is low. As a result, the discharge efficiency of light which passes through the composite thin film (4) from the substrate (1) to the external is improved.

22 Claims, 9 Drawing Sheets

U.S. PATENT DOCUMENTS

| | | | |
|---|---|---|---|
| 3,969,559 A | 7/1976 | Boe | 428/87 |
| 4,402,827 A | 9/1983 | Joseph | 210/314 |
| 4,432,956 A | 2/1984 | Zarzycki et al. | 428/338 |
| 4,610,863 A | 9/1986 | Tewari et al. | 423/338 |
| 5,124,364 A | 6/1992 | Wolff et al. | 521/55 |
| 5,137,279 A | 8/1992 | Murphy et al. | 273/257 |
| 5,594,585 A | 1/1997 | Komatsu | 359/512 |
| 5,607,764 A | 3/1997 | Konno et al. | 428/327 |
| 5,665,422 A * | 9/1997 | Endo et al. | 427/71 |
| 5,742,118 A | 4/1998 | Endo et al. | 313/479 |
| 5,854,708 A | 12/1998 | Komatsu et al. | 359/512 |
| 5,908,585 A | 6/1999 | Shibuta | 252/506 |
| 5,976,680 A | 11/1999 | Ikemori et al. | 428/212 |
| 6,013,372 A | 1/2000 | Hayakawa et al. | 428/411.1 |
| 6,040,053 A | 3/2000 | Scholz et al. | 428/212 |
| 6,083,314 A | 7/2000 | Nakashima et al. | |
| 6,090,873 A | 7/2000 | Okibe et al. | 524/265 |
| 6,111,699 A | 8/2000 | Iwata et al. | 359/599 |
| 6,455,154 B1 | 9/2002 | Nakashima et al. | |
| 6,562,737 B1 | 5/2003 | Bohin et al. | 442/59 |
| 6,741,307 B2 * | 5/2004 | Matsunaga et al. | 349/112 |
| 2001/0044489 A1 | 11/2001 | Hugo | |
| 2007/0190305 A1 * | 8/2007 | Yamaki et al. | 428/304.4 |

FOREIGN PATENT DOCUMENTS

| | | |
|---|---|---|
| EP | 0653377 | 5/1995 |
| EP | 0778476 | 6/1997 |
| EP | 0822240 | 2/1998 |
| EP | 0989169 | 3/2000 |
| EP | 1022587 | 7/2000 |
| EP | 1089093 | 4/2001 |
| EP | 1100129 | 5/2001 |
| JP | 60-213901 | 10/1985 |
| JP | 5-279011 | 10/1993 |
| JP | 6-3501 | 1/1994 |
| JP | 7-048527 | 2/1995 |
| JP | 7-138375 | 5/1995 |
| JP | 7-247144 | 9/1995 |
| JP | 9-115334 | 5/1997 |
| JP | 97/15935 | 5/1997 |
| JP | 10-096804 | 4/1998 |
| JP | 10-142402 | 5/1998 |
| JP | 10142402 | 5/1998 |
| JP | 11-6902 | 1/1999 |
| JP | 11-61043 | 3/1999 |
| JP | 11-160505 | 6/1999 |
| JP | 11-315223 | 11/1999 |
| JP | 11-329742 | 11/1999 |
| JP | 11326601 | 11/1999 |
| JP | 2001-066405 | 3/2001 |
| JP | 2001-154004 | 6/2001 |
| JP | 2001-188104 | 7/2001 |
| JP | 2001-202827 | 7/2001 |
| JP | 2001-233611 | 8/2001 |
| JP | 2002-079616 | 3/2002 |
| JP | 2002-317152 | 10/2002 |
| JP | 2003-149642 | 5/2003 |
| JP | 2003-202406 | 7/2003 |
| JP | 2003-216061 | 7/2003 |
| KR | 2000-19115 | 4/2000 |
| KR | 2001 0060297 | 7/2001 |
| WO | 96/33243 | 10/1996 |
| WO | 97/15935 | 5/1997 |
| WO | 99/02592 | 1/1999 |
| WO | 03/035780 | 5/2003 |

OTHER PUBLICATIONS

English Language Abstract of JP 5-279011.
Enblish Language Abstract of JP 2001-233611.
English Language Abstract of JP 10-142402.
English Language Abstract of JP 11-329742.
English Language Abstract of JP 2001-154004.
English Language Abstract of JP 2001-233611 published Aug. 28, 2001.
English Language Abstract of JP 6-3501 published Jan. 14, 1994.
S. Yamada, "Gosei Toryo—Gosei Kanseiyu oyobi Gosei Jushi—", 7$^{th}$ Edition, Seibundo Shinkosha Publishing Co., Ltd., Feb. 25, 1963, pp. 158-160, together with partial English language translation of the same.
English Language Abstract of JP 10-142402 published May 28, 1998.
English Language Abstract of JP 11-326601 published Nov. 26, 1999.
English Language Abstract of JP 2003-149642 published 2003-149642.
Patent Abstract of Japan, vol. 2002, No. 07, Jul. 3, 2002.
English Language Abstract of JP 10-096804.
English Language Abstract of JP 7-048527.
English Language Abstract of JP 11-160505.
English Language Abstract of JP 2001-066405.
English Language Abstract of JP 2001-188104.
English Language Abstract of JP 11-315223.
English Language Abstract of JP 9-115334.
English Languageg Abstract of JP 7-247144.
English Language Abstract of JP 60-213901.
English Language Abstract of JP 2002-317152.
English Language Abstract of JP 2003-216061.
English Language Abstract of JP 2003-202406.
Partial English language translation of Sadakichi Yamada, "Gosei Toryo-Gosei Kanseiyu Oyobi Gosei Jushi—", 7$^{th}$ Edition, Seibundo Shinkosha Publishing Co., Ltd., Feb. 25, 1963, pp. 158-160.
Partial English language translation of Edited by Kagaku Daijiten Hensu Iinkai, "Kagaku Daijiten 4", First Edition, 2$^{nd}$ Print, Kyoritsu Shuppan Co., Ltd., Jul. 5, 1962, pp. 870-871.
Nishida et al.: "Silica-Based Microparticle, Method for Producing Dispersion with the same, and Base Material with Coating Film". Patent Abstract of Japan JP 2001-233611, Aug. 28, 2001, pp. 1-2.
Nishida et al.: "Silica-Based Microparticle, Method for Producing Dispersion with the same, and Base Material with Coating Film". Machine translation of Japan JP 2002-233611, Aug. 28, 2001, pp. 1-13.
English Abstract of KR 2000-19115 which published Apr. 6, 2000.
Plasticsusa.com downloaded on Dec. 12, 2006 from the website http://www.plasticsusa.com/refract.html.

* cited by examiner

1 SUBSTRATE
2 FILLER
3 BINDER
4 COMPOSITE THIN FILM (a)

(b)

(a)

(b)

(a)

(b)

(a)

(b)

(a)

(b)

(a)

(b)

COMPOSITE THIN FILM HOLDING SUBSTRATE, TRANSPARENT CONDUCTIVE FILM HOLDING SUBSTRATE, AND PANEL LIGHT EMITTING BODY

CROSS-REFERENCE TO RELATED APPLICATIONS

The present application is filed claiming the benefits provided in the Paris Convention, based on Japanese Patent Application No. 2001-327878 (filed on Dec. 25, 2001, titled "Coating Material Compositions and Articles Coated with the Same") and Japanese Patent Application No. 2001-327878 (filed on Dec. 25, 2001, titled "Composite Thin Film Substrate, Transparent Conductive Substrate and Surface Light Emitting Device"), and the contents described in the above applications are partially incorporated herein to form a part of the present description by reference in their entirety.

TECHNICAL FIELD

The present invention relates to a surface light emitting device (or light emitting body) for the use in a variety of displays, display elements, backlights for liquid crystal displays or the like, and a composite thin film-holding substrate (or film-formed substrate) and a transparent electrically conductive film-holding substrate (or film-formed substrate) for the use in the surface light emitting device.

BACKGROUND ART

With the advancement of information-intensive society, a variety of displays have been developed. As one of the typical examples of thin film type light emitting elements for the use in such displays, organic electroluminescent (or EL) emitting devices are given.

FIG. 7 schematically shows a structure of an organic electroluminescent emitting body in its sectional view in which a light-emitting element (15) is provided on a light-transmitting substrate (1). Light emitted from the light-emitting element (15) passes through the substrate (1) and ejects out of an exposed surface of the substrate (1) so as to be taken out to the external. As shown by the arrows in FIG. 7, the light which enters the interface between the surface of the substrate (1) and ambient air at a small incident angle ejects out of the exposed surface of the substrate (1), while most of light reflects by the interface between the exposed surface of the substrate (1) and the ambient air, and are guided within the substrate (1) in directions toward edge portions of the substrate. As a result, it is practically only about 20% of the emitted light that can go out of the exposed surface of the substrate (1). This phenomenon is one of the main reasons why a light discharge efficiency (or light external efficiency or coupling-out efficiency) of the thin film type light-emitting elements is lowered.

To overcome this problem, various devices for avoiding such a phenomenon to thereby improve the light discharge efficiency from the exposed surface of the substrate (1) are proposed. For example, a light-diffusing layer (16) is formed on an exposed surface of a substrate (1) as shown in FIG. 8 which schematically shows a sectional view thereof by finely processing. According to this structure, light is diffused by the light-diffusing layer (16) of the substrate (1) so as to reduce the light guide within the substrate (1) so as to improve the light discharge efficiency from the exposed surface of the substrate (1) to its external. For such fine processing, microlens processing, diffusion processing and the like may be used.

However, in the case of FIG. 8, a thickness of the substrate (1) is generally in the order of millimeter, and therefore, it is a few times that light being guided strikes the light-diffusing layer (16). Thus, the effect of improving the light discharge efficiency by controlling light guiding is insufficient. Further, there arises another problem in that, since lights are diffused by the light-diffusing layer (16), lights are mixed which makes it hard to obtain sharp contrast when it is needed that emitted lights should be recognized as an image as in the case of a display and the like.

In other embodiment, there is provided a lower refractive index layer (17) having a lower refractive index (for example, 1.3 or lower) than that of a substrate (1) between the substrate (1) and a light-emitting element (15) as schematically shown in FIG. 9 in a sectional view. With this arrangement, light is refracted through the interface between the lower refractive index layer (17) and the substrate (1) to thereby reduce an incident angle of the light at interface between the exposed surface of the substrate (1) and ambient air. As a result, a quantity of light is decreased which is reflected by the interface between the exposed surface of the substrate (1) and the air, and consequently, the light guide within the substrate (1) is suppressed, and the light discharge efficiency from the surface of the substrate (1) to the external is improved.

In case of the embodiment shown in FIG. 9, the insertion of the lower refractive index layer (17) is able to substantially eliminate the light guide within the substrate (1), so that the light discharge efficiency can be improved. However, there is a problem in the case where a thickness of the light-emitting element (15) is large which has a refractive index higher than that of the lower refractive index layer (17). That is, a quantity of light becomes larger which is reflected by the interface between the light-emitting element (15) and the lower refractive index layer (17), so that there is a danger that the light guide is likely to be increased in the light-emitting element (15), which requires to deliberately select the thickness of the light-emitting element (15).

As described above, it is hard to improve the light discharge efficiency of the thin film type light-emitting elements in the case where emitted light is taken out to the external (into the ambience), and therefore, the improvement of the light discharge efficiency becomes a subject to be solved.

In general, the light discharge efficiency η where light which is generated in a light emitting device comprising a surface light-emitting element is taken out is determined by a critical angle θc upon total reflection where light is ejected from a medium having a refractive index of n into an air having a refractive index of 1.0, based on the classical optics rules.

The critical angle θc can be calculated by the following equation (1), according to the rule of refraction:

$$\sin \theta c = 1/n \tag{1}$$

The discharge efficiency η is determined by the following equation (2), from a ratio of a quantity of light which passes through a medium having a refractive index of n into an air to a total quantity of light generated (i.e. the sum of a quantity of light which is totally reflected by the interface between the medium and the air and a quantity of light which goes into the air):

$$\eta = 1 - (n^2 - 1)^{1/2}/n \tag{2}$$

It is noted that when the refractive index n of the medium is higher than 1.5, the following approximate equation (3) may be used. However, when the refractive index n of the medium is very close to 1.00, it is needed to use the above equation (2).

$$\eta = 1/(2n^2) \tag{3}$$

In the thin film type light emitting device such as an electroluminescent (EL) element or the like, a thickness of the part of the surface light-emitting element is smaller than a wavelength of the light, and therefore, the discharge efficiency η is mainly controlled by the refractive index of the substrate. The refractive index n of glass, a plastic film or the like used as the substrate is generally about 1.5 to about 1.6. Therefore, the discharge efficiency η is about 0.2 (about 20%) according to the equation (3). In other words, the rest of about 80% is lost as guided light due to the total reflection at the interface between the substrate and the air.

Typical examples of the thin film type light emitting devices include an organic EL element and a photoluminescent (or PL) light-emitting element comprising a PL light-emitting layer is also similar. The PL light-emitting element has a structure in which a PL light-emitting layer is laminated on a substrate. When the PL light-emitting layer of this element is irradiated with light such UV or the like, the PL light-emitting layer emits light, and the light ejects from the substrate. The light discharge efficiency η of this element is also low, and most of light is as guided light because, in general, the light-emitting device is formed on the substrate similarly to the above case.

Under the foregoing circumstances, Japanese Patent Kokai Publication JP-A-2001-202827 discloses a technique of lessening light loss as guided light within a substrate by forming a light-emitting element on a surface layer of a substrate which surface layer has a low refractive index. According to this publication, the light discharge efficiency is improved by forming a thin film light-emitting element on a thin film with the lower refractive index. In a light-emitting element having a thickness smaller than a wavelength of the light, the light guiding within its light-emitting layer is restricted, and therefore, a quantity of light to be able to be radiated through a surface of the light-emitting layer is increased. Specifically, for example "Applied Physics Letters" (vol. 78, No. 13, p. 1927) describes that a phenomenon where the light guiding is markedly restricted when a thickness of a light-emitting layer (a thickness of a transparent electrically conductive film is included in the case of an organic EL) is about 200 nm or less.

It is apparent from the above that the light discharge efficiency becomes higher when a light emitting device is produced by forming a light-emitting layer on a substrate which has a surface layer with a lower refractive index. In addition, it is advantageous for the formation of a light emitting device that a surface layer as a thin film which satisfies the following relationship (4) is formed on a substrate:

$$n2 < n1 \quad (4)$$

(wherein n1 is a refractive index of the substrate; and n2 is a refractive index of the surface layer having a lower refractive index previously formed on the surface of the substrate on the side where the light-emitting layer is to be formed). Glass and a plastic film are generally used as the substrate, and they have a refractive index of about 1.5 to about 1.6.

The number of combination of a substrate with a thin film to be formed on the substrate which satisfies the relationship of equation (4) can be said to be infinite. Practically, when the refractive index of a light-emitting layer and conditions for forming the light-emitting layer (e.g., temperature, a process for the formation, etc.) are appropriately selected, the light discharge efficiency of the light emitting device is improved as compared with a light emitting device comprising a substrate without any thin film on a surface thereof. Japanese Patent Kokai Publication JP-A-2001-202827 proposes that a thin film with a refractive index of 1.003 to 1.300 is provided on a surface of the conventional substrate, and specifically that a porous thin film such as silica aerogel is formed thereon. However, strength of this thin film with a low refractive index is not always sufficient, since the film is porous.

DISCLOSURE OF INVENTION

Accordingly, it is expected that the light-emitting efficiency can be improved by forming a thin film on the surface of a substrate independently of the kind of the substrate, as compared with the known techniques as described above. Such a thin film is desired to have strength and handling ease which are sufficient to form a light-emitting element.

Objects of the present invention are therefore to provide a substrate having a higher efficiency of taking light out to its external than any of the prior art substrates each having the thin layer and particularly, to provide a substrate having a composite thin film, and a transparent electrically conductive film-holding substrate and a surface light emitting device which comprises such a substrate.

It has been found that the above objects are achieved by a composite thin film-holding substrate which comprises a substrate and a composite thin film disposed on a surface of the substrate, wherein the composite thin film comprises a filler and a binder, and one of a refractive index (Nf) of the filler and a refractive index (Nb) of the binder is lower than a refractive index (Ns) of the substrate. In this regard, the other of the refractive index (Nf) of the filler and the refractive index (Nb) of the binder is lower than that of said one.

Therefore, the following two cases A and B are possible as to a relationship of the refractive indexes in the composite thin film-holding substrate of the present invention:

| Nf<Ns and Nf<Nb | Case A |
|---|---|
| Nb<Ns and Nb<Nf | Case B |

The present inventors have made further investigations and found that the objects of the present invention are also attained by using a composite thin film-holding substrate which comprises a substrate and a composite thin film disposed on a surface of the substrate, wherein the composite thin film comprises a filler and a binder, and both of refractive indexes (Nf) and (Nb) of the filler and the binder are higher than a refractive index (Ns) of the substrate.

Therefore, the relationship of the refractive indexes in this composite thin film-holding substrate of the present invention satisfies the following case C.

| Ns<Nb and Ns<Nf | Case C |
|---|---|

According to the present invention, the composite thin film is obtained by applying a liquid coating material composition which comprises the filler and a binder-forming material, on a substrate to form an applied layer, and drying the applied layer to obtain a coating film left on the substrate. The word "drying" means that a liquid component (or a volatile component) is removed from the applied layer to leave a solid coating layer to remain; and, if needed, the applied layer may be heated to dryness. It is noted that the coating layer obtained by drying may be treated thereafter by heating, and heating for the drying may be continued to thereby carry out the heat treatment of the coating layer.

In the composite thin film, the filler is dispersed in the binder formed from the binder-forming material, and the filler and the binder form mutually different phases, and the wording "composite" is used in this sense. The binder holds the filler therein while binding the filler in a dispersed state. The binder is formed from the binder-forming material by drying the coating material composition in the form of an applied film. Although the binder-forming material may chemically change or may not change during upon such drying, the binder-forming material in the state of being dissolved and/or dispersed in the coating material composition is transformed into a layer-like solid as a whole. In this regard, the coating material composition generally contains a liquid solvent and/or a dispersion medium (for example, water and an organic solvent such as an alcohol (e.g., methanol, ethanol, isopropyl alcohol or the like), toluene, xylene, methyl ethyl ketone or the like) so as to form a liquid-like composition which can be applied to the substrate, and, if needed, it may contain other component. Examples of such other component include a leveling agent for forming a smooth and flat applied film, such as an acrylic polymer; a thickener for controlling a thickness of the film, such as an ethylene glycol derivative (e.g., ethylene glycol, ethylene glycol monobutyl ether, ethylene glycol monoethyl ether acetate, etc.), a diethylene glycol derivative (e.g., diethylene glycol, diethylene glycol monobutyl ether, etc.); a high boiling point solvent; and a silane coupling agent for imparting adhesiveness to the film relative to the substrate; and the like.

It is preferable in the composite thin film-holding substrate of the present invention that both the refractive indexes of the filler and the binder, (Nf) and (Nb), are lower than the refractive index (Ns) of the substrate. Alternatively, at least one of the refractive indexes of the filler and the binder, (Nf) and (Nb), may be equal to or higher than the refractive index (Ns) of the substrate.

The first aspect of the present invention is therefore to provide a composite thin film-holding substrate according to the case A: that is, the composite thin film-holding substrate comprises a substrate and a composite thin film disposed on a surface of the substrate, wherein the composite thin film comprises a filler and a binder, and the refractive index (Nf) of the filler is lower than the refractive index (Nb) of the binder and also lower than the refractive index (Ns) of the substrate.

In the composite thin film-holding substrate according to the first aspect, the filler to be preferably used is, for example, at least one selected from aerogel fine particles, hollow silica fine particles and hollow polymer fine particles; and the binder to be preferably used is at least one selected from organic polymers and metal oxides.

The second aspect of the present invention is to provide a composite thin film-holding substrate according to the case B: that is, the composite thin film-holding substrate comprises a substrate and a composite thin film disposed on a surface of the substrate, wherein the composite thin film comprises a filler and a binder, and the refractive index (Nb) of the binder is lower than the refractive index (Nf) of the filler and also lower than the refractive index (Ns) of the substrate.

In the composite thin film-holding substrate according to the second aspect, the binder is preferably a silica porous material such as SILICONE RESIN-M (which may be a condensation-polymerized product, if it is condensation-polymerizable) which will be described later, aerogel or the like; and the filler is preferably at least one selected from organic polymer fine particles, metal compound fine particles, and hollow silica fine particles.

The third aspect of the present invention is to provide a composite thin film-holding substrate according to the case C: that is, the composite thin film-holding substrate comprises a substrate and a composite thin film disposed on a surface of the substrate, wherein the composite thin film comprises a filler and a binder, and both of the refractive indexes of the filler and the binder, (Nf) and (Nb), are higher than the refractive index (Ns) of the substrate.

In the composite thin film-holding substrate according to the third aspect, the binder to be used is preferably an organic polymer or a metal oxide which has a refractive index of 1.8 or lower, such as an acrylic polymer, a silica/titania composite oxide or the like, which will be described later; and the filler to be used preferably is similarly at least one selected from organic polymer fine particles and metal compounds. In the third aspect, it is necessary that a mixing ratio of the binder to the filler in the coating material composition should be properly adjusted so that a volume ratio of the solid contents in the resultant composite thin film is 75% or less.

In the first aspect, the refractive index of the filler which is lower than the refractive index of the substrate is generally 1.35 or lower, and preferably 1.30 or lower. In the second aspect, the refractive index of the binder which is lower than the refractive index of the substrate is generally 1.45 or lower, and preferably 1.30 or lower. In the third aspect, the refractive index of the binder which is higher than the refractive index of the substrate is generally 1.8 or lower, and preferably 1.6 or lower. In any of the foregoing aspects, the refractive index of the composite thin film is generally 1.4 or lower, and preferably 1.35 or lower.

The fourth aspect of the present invention is to provide a transparent and electrically conductive film-holding substrate which comprises any of the above composite thin film-holding substrates of the present invention as described above and a transparent and electrically conductive film formed on the composite thin film. In this transparent and electrically conductive film-holding substrate, the transparent and electrically conductive film may be formed on a very thin smoothening backing layer (for example, with a thickness of about 10 nm to about 100 nm) which is formed on the composite thin film.

The fifth aspect of the present invention is to provide a surface light emitting device which comprises any of the above composite thin film-holding substrates of the present invention and a thin film of an organic or inorganic fluorescent material which is excited by UV or an electron ray to emit light, the thin film being formed on the composite thin film of the composite thin film-holding substrate.

The sixth aspect of the present invention is to provide another surface light emitting device which comprises the above transparent and electrically conductive film-holding substrate of the present invention, and a light-emitting layer and a metal electrode which are laminated (or formed) in thus described order on the transparent and electrically conductive film to thereby form an electroluminescent element (or electroluminescent device).

Figure 1:
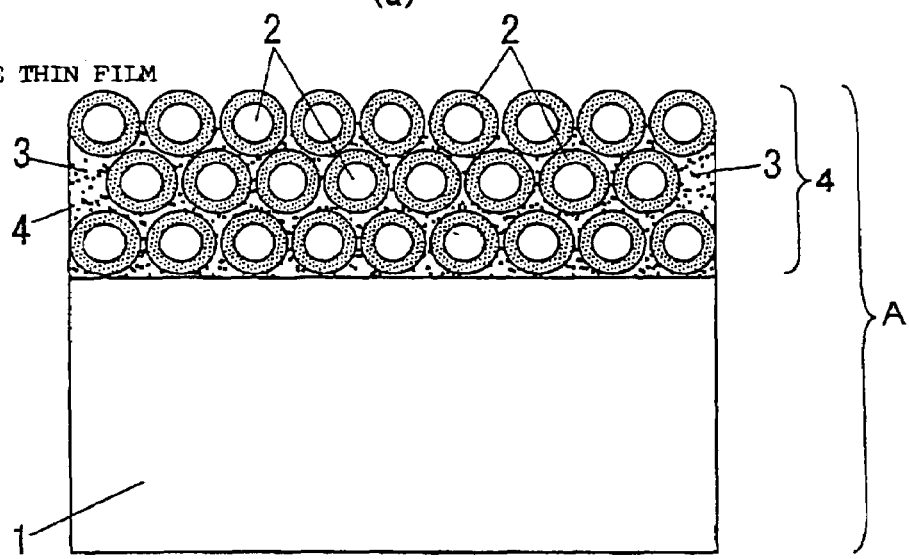
FIGS. 1(a) and 1(b) respectively illustrate examples of composite thin film-holding substrates according to an embodiment of the present invention, schematically showing the sectional views thereof, and a light-emitting element is provided in FIG. 1(b).
Figure 1:
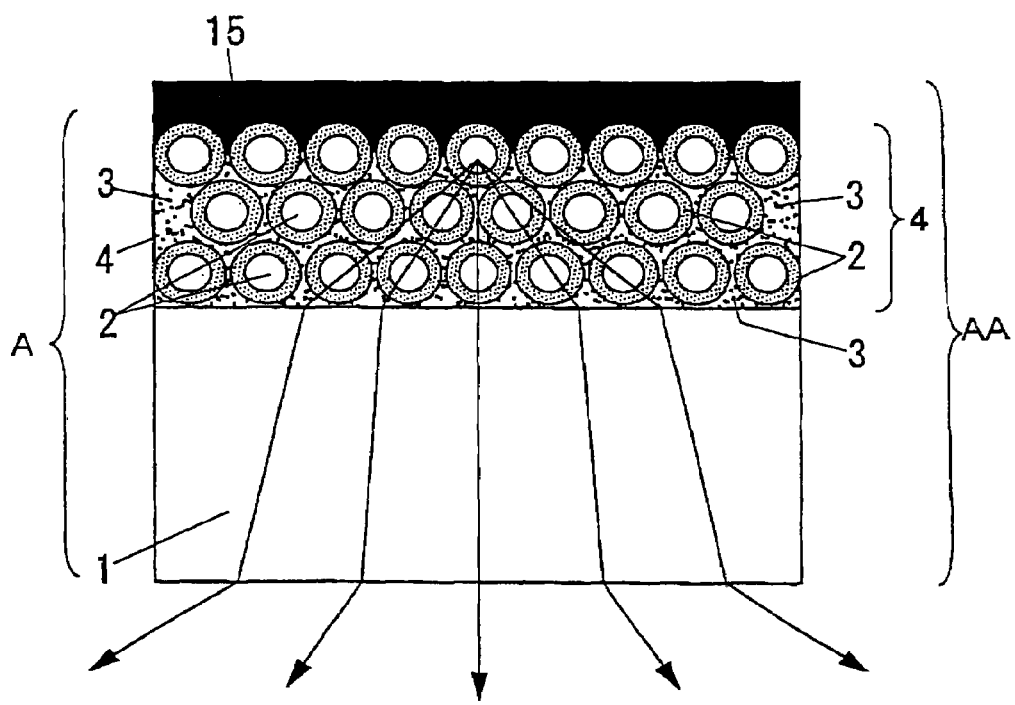

In the drawings, the reference numerals refer to the following: 1=substrate, 2=filler, 3=binder, 4=composite thin film, 5=transparent and electrically conductive film, 6=smoothening backing layer, 7=fluorescent thin film, 8=light-emitting layer, 9=metal electrode, and 10=electroluminescent element (or electroluminescent device).

EMBODIMENTS FOR CARRYING OUT THE INVENTION

There is no particular limit as to the substrate for the use in the composite thin film-holding substrate according to the present invention, in so far as the substrate is permeable to light. The substrate is generally in the form of a sheet or a plate. There is no particular limit as to of the kind of the substrate, as far as it is used as a light-transmitting plate such as a transparent glass plate, a transparent plastic plate or the like. The refractive index of the substrate of this type is, in many cases, in the range between 1.46 and 1.6.

As a material used for the filler in the composite thin film-holding substrate of the present invention, aerogel fine particles, hollow silica fine particles, hollow polymer fine particles, organic polymer fine particles, metal oxide fine particles and the like are given. As a material used for the binder, organic polymers, metal oxides, porous silica materials (particularly, SILICONE RESIN-M, silica aerogel, etc. as described later) and the like are given. A possible combination of the filler and the binder which satisfies the above refractive index relationship is selected from these usable materials. Next, the filler and the binder will be described.

The term "refractive index" herein referred to means a refractive index determined as follows, unless otherwise specified.

(Refractive Index of Filler)

The refractive index of the filler which may be in the form of solid fine particles, porous fine particles, or hollow fine particles (including particles whose shells are porous) can be determined as follows.

A refractive index and a specific gravity of a sol which is in the state of a dispersion of the filler in a solvent such as typically water or alcohol is measured. Then, the refractive index of the filler is calculated by the following equation, using the refractive index and the specific gravity of the sol, a refractive index and a specific gravity of the solvent forming the sol, and a refractive index and a true specific gravity of a material forming the filler:

Considering that "the refractive index of the filler—1" is equal to n leads to the following equation:

$$n = n_0(PN_0 - P_0N)/\{n_0(P-P_0) + p_0(N_0-N)\}$$

So that the refractive index of the filler becomes equal to "n+1".

It is noted that the notations in the above equation indicate the following, and the above equation is derived from the following equations (a), (b) and (c).

Each of the equations (a) and (b) represents the relationship between a refractive index and a specific gravity of a uniform mixture of two different materials, which is obvious to those skilled in the art. On the other hand, as to a filler as a porous material which have fine voids with a size (generally, a diameter) in the order of submicron or lower, a refractive index of the filler is determined by a volume ratio of its solid portion to its void portion of the porous material, and it is generally known between a refractive index of the porous material and a solid content percentage of the porous material (i.e., 1—a void rate of the porous material) that a value of [the refractive index of the porous material—1] is proportional to the solid content rate. Based on this relationship, the equation (c) is used to calculate a value of [a refractive index of the porous material—1], i.e., n, using a true specific gravity ($p_0$) of a substance forming the porous material and a value of (a true refractive index of the substance—1 (i.e. a refractive index of a pure substance in a solid state forming the porous material—1: $n_0$), and a bulk specific gravity (p) of the porous material. This equation (c) is also known to those skilled in the art. It is noted that the equation (c) is originally applicable to a porous filler, and the equation is also similarly applicable to hollow fine particles (including particles of which shells are porous). The equation (c) is further applicable to the filler of solid particles, provided that the true specific gravity is equal to the bulk specific gravity, and that the refractive index of the filler is equal to the refractive index of the substance composing the filler. Therefore, needless to say, the refractive index of the filler can be obtained by the above equation.

Refractive index of sol (measurement value)=N+1
Refractive index of solvent=$N_0$+1
Refractive index of material forming filler=$n_0$+1
Specific gravity of sol(measurement value)=P
Specific gravity of solvent=$P_0$
True specific gravity of material forming filler=$p_0$
Bulk specific gravity of filler=p
The ratio of volume of filler occupying in sol=V $$V=(N-N_0)/(n-N_0) \quad (a)$$

$$V=(P-P_0)/(p-P^0) \quad (b)$$

$$n=pn_0/p_0 \quad (c)$$

(Refractive Index of Binder)

It is a refractive index of a coating film obtained as follows, which index is determined by ellipsometry: a liquid mixture of a binder-forming material dissolved and/or dispersed in an appropriate solvent (e.g., an alcohol such as methanol, isopropyl alcohol or the like) is applied to a substrate to form an applied film, from which a liquid component (or a volatile content) is removed to dry the coating film. The resultant coating film left on the substrate forms the part of the binder in the composite film of the present invention.

(1-1) As to Aerogel Fine Particles as Filler

As aerogel fine particles, there can be used, for example, silica aerogel fine particles, composite aerogel fine particles such as silica/alumina aerogel fine particles, organic aerogel fine particles such as melamine aerogel fine particles, etc. The silica aerogel is prepared by the process described in for example U.S. Pat. Nos. 4,402,827, 4,432,956 and 4,610,863 wherein a wet-gel compound having a silica skeleton, obtained by hydrolysis and condensation polymerization of an alkoxy silane (which is also called a silicon alkoxide or an alkyl silicate) is dispersed in a solvent (or a dispersion medium) such as an alcohol, carbon dioxide or the like, and the resulting dispersion is subjected to drying under a supercritical condition of not lower than the critical point of the solvent. The drying under the supercritical condition may be carried out, for example, by immersing the wet-gel compound in a liquefied carbon dioxide, thereby substituting a whole or a part of the solvent previously contained in the wet-gel compound with the liquefied carbon dioxide which has a critical point lower than that of the liquefied carbon dioxide; and thereafter drying the wet-gel compound under the supercritical condition of the carbon dioxide alone or the mixed system of carbon dioxide and the solvent. In this connection, the contents of the above US patents are incorporated in the description of the present application by the above reference thereto in their entirety.

Alternatively, the silica aerogel can be prepared in the same manner similarly to the above, from sodium silicate as a starting material, as described in U.S. Pat. Nos. 5,137,279 and 5,124,364. The contents of these US patents are also incorporated in the description of the present invention by the reference thereto in their entirety.

It is preferable that a hydrophobicity is given to the silica aerogel as disclosed in Japanese Patent Kokai Publications JP-A-5-279011 and JP-A-7-138375, by subjecting to a hydrophobing treatment the wet-gel compound obtained by the hydrolysis and condensation polymerization of the alkoxysilane as above. Thus, moisture, water or the like is hard to penetrate thus treated hydrophobic silica aerogel, and it becomes possible to prevent the deterioration of the performance of the silica aerogel, such as a refractive index and a light-transmitting property thereof. The step of the hydrophobing treatment can be carried out before or during the supercritical drying of the wet-gel compound. It is noted that the above Japanese Patent Kokai Publications are also incorporated in the description of the present invention by reference thereto in their entirety.

The hydrophobing treatment is carried out by reacting a hydroxy moiety of a silanol group present on a surface of the wet-gel compound with a functional group of a hydrophobing agent to thereby convert the silanol group into a hydrophobic group of the hydrophobicity-imparting agent. For example, the hydrophobing treatment is carried out by immersing a gel in a hydrophobicity-imparting solution of a hydrophobing agent in a solvent, and mixing the gel and the solution to allow the hydrophobicity-imparting agent to permeate the gel, while if necessary, heating such a gel mixture so that a hydrophobicity-imparting reaction occurs. Examples of the solvent for use in the hydrophobing treatment include methanol, ethanol, isopropanol, xylene, toluene, benzene, N,N-dimethylformamide, hexamethyldisiloxane and the like. There is no particular limit in selection of the solvent, in so far as the solvent can easily dissolve the hydrophobing agent and can replace the solvent contained in the gel before the hydrophobing treatment.

In the case where the supercritical drying is carried out after the hydrophobing treatment, the solvent to be used in the hydrophobing treatment is preferably a medium that facilitates the supercritical drying (e.g., methanol, ethanol, isopropanol, liquefied carbon dioxide or the like), or a medium which can be replaced with the former medium. Examples of the hydrophobing agent include hexamethyldisilazane, hexamethyldisiloxane, trimethylmethoxysilane, dimethyldimethoxysilane, methyltrimethoxysilane, ethyltrimethoxysilane, trimethylethoxysilane, dimethyldiethoxysilane, methyltriethoxysilane and the like.

The aerogel fine particles to be used as the filler in the present invention can be obtained by pulverizing the silica aerogel prepared as described above. Alternatively, the aerogel fine particles can be obtained by pulverizing wet gel before drying, and drying the same. In the case where the fine aerogel particles are prepared from sodium silicate as a starting material, the aerogel fine particles are obtained by carrying out the pulverization in the course of the suspension polymerization. It is noted that it is possible to control the refractive index of the silica aerogel thus obtained to a desired value by suitably selecting the kind of the starting materials for the use in the preparation of the silica aerogel, a blending ratio thereof, etc.

(1-2) As to Silica Hollow Fine Particles as Filler

As to the silica hollow and fine particles usable as the filler, hollow silica sol prepared by the method described in Japanese Patent Kokai Publication JP-A-2001-233611 and other commercially available hollow silica particles can be used. The term "fine and hollow particles" referred to throughout the description of the present application means fine particles each of which has a void portion enclosed by a shell, and any of known suitable fine and hollow silica particles may be used. The shells of the silica hollow and fine particles are made of a silica based inorganic oxide. For example, the following are particularly preferable for the use as the silica hollow and fine particles:

The shell made of the silica based inorganic oxide include (A) a single layer of silica, (B) a single layer of a composite oxide of silica and an inorganic oxide other than silica, and (C) a double layer comprising the above layers (A) and (B). The shell may be a porous layer having pores or may be a layer having pores which are blocked to seal the void portion against the outside of the shell. It is preferable that the shell comprises a plurality of the silica based coating layers which include a first silica coating layer as an inner layer and a second silica coating layer as an outer layer. The provision of the second silica coating layer as the outer layer densifies the shell by blocking the pores of the shell, and further leads to fine and hollow silica particles having a sealed void therein.

A thickness of the shell is preferably 1 nm to 50 nm, and particularly 5 nm to 20 nm. When the thickness of the shell is less than 1 nm, some of the fine and hollow particles may have not predetermined shapes. When the thickness of the shell, on the contrary, exceeds 50 nm, the void in the fine and hollow silica particle becomes smaller, with the result that a ratio of the void decreases, and consequently, the refractive index of the particles may be insufficiently lowered. In addition, the thickness of the shell is preferably in the range between $1/50$ and $1/5$ of an average particle diameter of the fine and hollow particles. In the case where the shell contains the first silica coating layer and the second silica coating layer as mentioned above, it is sufficient that the total thickness of these layers is 1 nm to 50 nm described above. Particularly, the thickness of the second silica coating layer is preferably 20 nm to 40 nm for the densified shell.

It is noted that the void portions of the fine and hollow silica particles may contain the solvent used for the preparation of the particles and/or a gas which enters the void portions while the particles are being dried. The void portions of the fine and hollow silica particles further may retain therein a precursor substance which is used and left for forming the voids, which will be described later. The precursor substance may remain in a very small amount while adhering to the shell of the particle, or may occupy most of the voids of the particle. The term "precursor substance" herein referred to is a porous substance which is left after a portion of a component of a core particle enclosed by a shell is removed. As the core particle, a porous composite oxide particle of silica and an inorganic oxide other than silica is used. As the inorganic oxide, at least one or two selected from $Al_2O_3$, $B_2O_3$, $TiO_2$, $ZrO_2$, $SnO_2$, $Ce_2O_3$, $P_2O_5$, $Sb_2O_3$, $MoO_3$, $ZnO_2$, $WO_3$, etc. may be used. As the inorganic oxide comprising at least two selected from the above, $TiO_2$—$Al_2O_3$, $TiO_2$—$ZrO_2$ and the like may be exemplified. It is noted that the above mentioned solvent or gas may be present within the pores of this porous material. When an amount of the component removed from the core particle is larger, a volume of the void tends to increase, and the resultant fine and hollow silica particle can have a lower refractive index. A transparent coating film obtained from a composition blended with such fine and hollow silica particles has a low refractive index and an excellent antireflection performance.

As mentioned above, the average particle diameter of the fine and hollow silica particles in the present invention is in the range between 5 nm and 2 μm. When the average particle diameter is smaller than 5 nm, the effect of lowering the refractive index due to the presence of the voids is poor. On the contrary, when the average particle diameter is larger than 2 μm, its transparency is extremely poor, and the influence of the diffuse reflection (Anti-Glare) becomes higher. In the present invention, one of applications of a composite thin film which is required to have a high transparency is found in, for example, providing an antireflection property at the uppermost surface of a display. To achieve such a high transparency, the particle diameter of the fine and hollow silica particles to be used is preferably 5 to 100 nm. It is noted that the particle diameter referred to in the present description is a number-average particle diameter which is determined by the observation with a transmission electron microscope.

The process for preparing the fine and hollow silica particles as described above is described in detail in Japanese Patent Kokai Publication JP-A-2001-233611 (P2001-233611A). The fine and hollow silica particles which can be used in the coating composition of the present invention can be prepared by those skilled in the art according to the process described in this publication. The contents of this publication are incorporated in the present description by reference thereto in their entirety.

It is possible to control the refractive index of the fine and hollow silica particles to a desired value by suitably adjusting the thickness of the shell and the particle diameter in the course of producing the fine and hollow particles.

While the shells of the fine and hollow silica particles may comprise the densified layers or the porous layers, it is preferable that the distributions of the particle diameters and the thickness of the shells are uniform. This is because the particle diameter and a volume ratio of the fine and hollow particles occupying in the composite thin film determine the refractive index of the resultant composite thin film.

(1-3) Polymer Hollow Fine Particles as Filler

As the filler for the use in the composite thin film of the composite thin film-holding substrate of the present invention, fine and hollow polymer particles can be used. The shells of the fine particles are formed from a polymer material such as a fluorine polymer. A variety of the fine particles of this type are disclosed in for example Japanese Patent Kokai Publication JP-A-10-142402, and the contents of this publication are incorporated in the present description by reference thereto in their entirety. Particularly preferable fine and hollow polymer particles to be used are fluorine polymers, and the use of such polymers is effective to easily lower the refractive index of the resultant composite thin film.

The refractive index of the fine and hollow polymer particles can be controlled to a desired value by appropriately selecting the particle diameter and the polymer materials of the particles.

(1-4) As to Organic Polymer Fine Particles as Filler

As the filler for the use in the composite thin film of the composite thin film-holding substrate of the present invention, fine particles of an organic polymer can be used. Examples of the organic polymer include silicone resins acrylic resins, styrene resins, etc. Such polymer can be obtained as a filler in the form of fine particles by suspension-polymerization, supercritical polymerization or the like. However, other methods may be employed in so far as such fine particles can be obtained. The refractive index of the fine organic polymer particles can be controlled to a desired value by appropriately selecting the polymer materials for the particles.

(1-5) Metal Oxide Fine Particles as Filler

As the filler for the use in the composite thin film of the composite thin film-holding substrate of the present invention, fine particles of a metal oxide can be used. Examples of the fine particles of the metal oxide include fine particles of titania, tin indium oxide, silica, alumina, etc. The fine particles of these metal oxides are previously mixed into the coating compositions, using sol commercially available dispersion sol. Particularly preferable fine metal oxide particles to be used are for example the titania fine particles and the tin indium oxide fine particles in the case of selecting the metal oxide particles having a relatively high refractive index, and for example the silica fine particles in the case of selecting the metal oxide particles having a relatively low refractive index. The refractive index of the metal oxide fine particles can be controlled to a desired value by appropriately selecting the materials for the particles.

(2-1) Organic Polymer as Binder

As the binder for the use in the composite thin film of the composite thin film-holding substrate of the present invention, an organic polymer can be used which may be the same as the polymer forming the above described organic polymer fine particles. Such a polymer is in a dissolved and/or dispersed condition in a liquid coating material composition, and this coating material composition is applied and dried to form a solid coating film which contains the filler dispersed therein. In this case, the organic polymer itself is a binder-forming material and also a binder. Other preferable examples of such polymer are acrylic resins, fluorine resins and the like which have excellent transparency, and also may be the conventional polymers for the use in an optical thin film coating.

In other embodiment, the binder-forming material may be chemically changed into the binder in the course of drying the resultant film which is obtained by applying the coating material composition. For example, the binder-forming material may be a reactive (for example cross-linkable or condensation-polymerizable) organic monomer, an organic oligomer or an organic prepolymer, which is reacted to form the organic polymer as the binder. Such an organic monomer, an organic oligomer or an organic prepolymer as the reactive binder-forming material is dissolved and/or dispersed in a liquid coating material composition. Preferable examples of such organic monomer, organic oligomer or organic prepolymer are epoxy based monomers, oligomers and prepolymers, and the like.

The refractive index of such an organic polymer can be controlled to a desired value by suitably selecting an organic polymer, or an organic monomer, an organic oligomer or an organic prepolymer which provides such organic polymer.

(2-2) Silica Porous Material as Binder

Silica porous materials can be used as the binder for the use in the composite thin film of the composite thin film-holding substrate of the present invention. The silica porous material herein referred to means a material in which silica as a binder for holding the filler in a dispersed state contains a lot of fine voids. Such a silica porous material is preferably used when a silica based material is used as the filler.

As a binder-forming material which can be used to form a particularly preferable porous silica material, a silane compound of the general formula (1) is given:

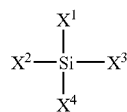

(1)

(wherein each of the substituents $X^1$, $X^2$, $X^3$ and $X^4$ is a group selected from hydrogen, a halogen (such as chlorine, fluorine or the like), a monovalent hydrocarbon group, an alkoxy group represented by OR (in which R is a monovalent hydrocarbon group) and hydroxyl group represented by OH, with the proviso that these groups ($X^1$, $X^2$, $X^3$ and $X^4$) may be different from one another, or partially different therefrom, or may be all the same, and that at least two of these groups are selected from an alkoxy group and hydroxyl group, respectively).

This silane compound has at least two, preferably at least three, more preferably at least four same or different alkoxyl groups and/or hydroxyl groups. The binder-forming material may be one which is obtained by hydrolyzing at least one of the alkoxyl groups of the silane compound.

In other embodiment, the binder-forming material is a siloxane compound or a polysiloxane compound which is produced by hydrolyzing one or more of the above silane compounds when hydrolyzable, and condensing the hydrolyzed product. It is noted that the polysiloxane compound means a compound having at least two siloxane bonds. Preferably, this (poly)siloxane compound (i.e. the siloxane compound or the polysiloxane compound) has at least two of alkoxy groups and hydroxyl group as substituents.

In the case where the above silane compound and the (poly)siloxane compound have an alkoxyl group, such compounds can have a hydroxyl group which is formed by hydrolyzing the alkoxyl group. As a result, such silane compound and the (poly)siloxane compound can also form porous silica as the binder by at least partially condensing and crosslinking upon applying and drying the coating material composition. Even in the case where the (poly)siloxane compound has no alkoxy group and/or hydroxyl group as a substituent, a porous binder can be formed in the course of applying and drying the coating material composition.

A particularly preferable silica porous material is obtained as follows: a coating material composition is prepared by using, as the binder-forming material, a polysiloxane compound which is obtained by partially or fully hydrolyzing a tetra-functional hydrolyzable organosiloxane having 4 hydrolyzable substituents on a silicon atom represented by the formula: $SiX_4$ (wherein X is a hydrolyzable substituent having 1 to 4 carbon atoms, such as an alkoxyl group having 1 to 5 carbon atoms) (herein such polysiloxane compound is referred to as "SILICONE RESIN-M"); and condensation-polymerizing the resultant hydrolyzed product; and then, the coating material composition is applied, and the resultant applied layer is dried to obtain the above silica porous material. To discriminate such polysiloxane compound as the binder-forming material from the generally known "silicone resins", the polysiloxane compound as described above is specifically called "SILICONE RESIN-M" in the present description. This SILICONE RESIN-M is not necessarily the same one as the generally known silicone resin.

The SILICONE RESIN-M itself may have a hydrolyzable substituent. In this case, the SILICONE RESIN-M is hydrolyzed and condensed to form the binder having a larger molecular weight as SILICONE RESIN-M. In the case where the SILICONE RESIN-M has not such a substituent, the SILICONE RESIN-M as it is forms the binder.

The above described binder-forming material is contained in the coating material composition together with the filler, and the coating material composition is applied to a substrate, and the obtained applied layer is dried to obtain a composite thin film containing the filler dispersed in the binder. The refractive index of such a silica porous material as the binder can be controlled to a desired value by suitably changing a weight ratio of the binder-forming materials and the filler.

Preferably, the SILICONE RESIN-M for forming the silica porous material has a weight-average molecular weight of about 200 to about 2,000, more preferably 600 to 1,200, when the composite film is required to have mechanical strength. When the SILICONE RESIN-M has a molecular weight within this range, the strength of the resultant composite film is improved, and the porosity of the binder (i.e., a ratio of the voids in the binder) tends to increase. When the composite film is not required to have a high mechanical strength, it is preferable that the SILICONE RESIN-M has a weight-average molecular weight of at least about 2,000, more preferably at least 3,000, and for example within a range of 3,000 to 5,000.

If needed, the composite film formed by using the SILICONE RESIN-M may be subjected to a heating treatment at a temperature of preferably 100 to 300° C., more preferably 50 to 150° C. for 5 to 30 minutes so as to improve the mechanical strength of the composite film.

In other embodiment, the silica porous material may be a silica aerogel. This aerogel as the binder is formed as follows. A wet-gel compound obtained by hydrolyzation and polymerization of an alkoxysilane as described above (silicone alkoxide, particularly the above-mentioned tetra-functional alkoxysilane) or by gelation of an aqueous sodium silicate solution is used as the binder-forming material to be contained in the coating material composition; the resultant coating material composition is applied so as to obtain an applied film, which is dried to thereby form a composite film which contains the binder while holding the filler therein. In this case, the binder-forming material is at least one selected from an alkoxysilane, a hydrolyzed product thereof (including a partially hydrolyzed product thereof in which all the alkoxyl groups are not necessarily hydrolyzed, but only a part of the alkoxyl groups are hydrolyzed) and a condensed product of the hydrolyzed product. In general, it is preferable that the binder-forming material is a condensed product of the hydrolyzed product. Such a silica aerogel can be obtained in the manner as described above. A composite thin film where the filler is dispersed in silica aerogel can be obtained by mixing the filler into a wet-gel compound in a wet state, and drying the mixture. Accordingly, the coating material composition comprises the wet-gel compound and the filler.

The refractive index of this aerogel as the binder can be controlled to a desired value by selecting a suitable blending ratio of starting material solutions, a suitable drying method, etc.

(2-3) Metal Oxide as Binder

It is possible to use a metal oxide as the binder for the use in the composite thin film of the composite thin film-holding substrate of the present invention. In this case, a precursor of a metal oxide which is contained as the binder-forming material in the coating material composition is changed into such a metal oxide as the binder in the course of drying an applied film obtained by applying the coating material composition. Examples of such a precursor of the metal oxide to be preferably used include silica, silica/titania composite oxide, etc. The refractive index of the metal oxide as the binder can be controlled to a desired value by selecting suitable constitutive elements of a material which results in the metal oxide.

In the composite thin film-holding substrate of the present invention, a combination of the filler and the binder as described above is suitably selected so that the above relationship between each of the refractive indexes is satisfied. It is noted that the refractive index of the composite thin film formed by using such a combination of the filler and the binder (i.e., the refractive index of a whole of the composite film) is generally lower than a refractive index of the filler, a refractive index of the binder or a refractive index which is theoretically calculated from a ratio of the filler to the binder in the thin film formed. This is because the binder of the formed composite thin film may contain, in addition to voids which may be intrinsically present in the material itself for the binder (e.g., the void portions due to the porosity of the binder), voids between each of the fine particles composing the filler and further voids between the fine particles of the filler and the binder. It is the fact that when the filler and the binder-forming material are mixed to form a composite film, such other voids as above are contained in the composite thin film, and these other voids act to lower the refractive index of the composite thin film. In the present description, the refractive index of the composite thin film means an overall refractive index with taking the effects of such other voids into consideration.

In the composite thin film formed from the coating material composition of the present invention, the binder, which acts as the matrix present around the particles of the filler, contains lots of fine voids therein. Therefore, the apparent specific gravity of the binder is smaller than a true specific gravity of the material itself which forms the binder (i.e., a material having practically no void). A ratio of the apparent specific gravity of the binder to the true specific gravity of the binder is preferably 0.90 or less, more preferably 0.75 or less, and for example, within a range of 0.50 to 0.75. The values of these ranges are calculated by taking the volume of "other voids" as described above into account, if the composite film contains such voids. In this connection, the voids in the binder usually contain ambient gas of the coating film.

In one example, an average refractive index of a composite thin film which contains a tetra-functional silicone resin (i.e., SILICONE RESIN-M) as the binder having a refractive index of 1.45, and fine and hollow silica particles as the filler having a refractive index of 1.32 at a volume ratio of the binder/the filler of 0.1 to 0.3 can be 1.26 to 1.35.

In another example, an average refractive index of a composite thin film which contains silica aerogel as the binder having a refractive index of 1.20 and fine acrylic polymer particles as the filler having a refractive index of 1.59 at a volume ratio of the binder/the filler of 0.5 to 0.75 can be 1.30 to 1.40.

In a further example, an average refractive index of a composite thin film which contains an acrylic polymer as the binder having a refractive index of 1.59 and fine particles of a silica/titania composite oxide as the filler having a refractive index of 1.6 at a volume ratio of the binder/the filler of 0.05 to 0.15 can be 1.35 to 1.40. As to this composite thin film, calculation based on an apparent volume of the composite thin film and weights of the binder and the filler shows that about 40% of the volume of the composite thin film is occupied by the voids, and therefore the average refractive index of the composite thin film is lower than the refractive index of the filler and also lower than the refractive index of the binder.

Hereinafter, embodiments of the present invention will be described with reference to the accompanying drawings.

FIG. 1(a) is a schematic sectional view of an embodiment of a composite thin film-holding substrate A according to the first aspect of the present invention. In this embodiment, a composite thin film (4) comprising a filler (2) and a binder (3) is formed on a surface of a substrate (1). The composite thin film (4) is formed by applying a liquid-like coating material composition which is a mixture of the filler and a binder-forming material, to a surface of the substrate (1), and drying the resultant applied layer. In this embodiment, the refractive index of the filler (2) is lower than that of the substrate (1), and the refractive index of the binder (3) formed is higher than that of the filler (2). The substrate (1) is the same one as described above.

The refractive index of the filler (2) is not particularly limited, in so far as it is lower than the refractive index of the substrate (1). The refractive index of the filler (2) is usually lower than 1.35, preferably lower than 1.3 so as to lower an average refractive index of the composite thin film (4). Since it is desirable that the refractive index of the filler (2) is as low as possible, the lower limit of the refractive index of the filler is ideally 1.0, but it is practically 1.003. The lower limit may generally be 1.1. The refractive index of the binder is not particularly limited, in so far as it is higher than the refractive index of the filler. Generally, the refractive index of the binder is lower than 1.5, preferably lower than 1.46 so as to lower the average refractive index of the composite thin film (4).

As the filler (2) having the refractive index lower than that of the substrate (1), there can be used, for example, aerogel fine particles, silica fine and hollow particles, polymer fine and hollow particles, etc. as described above.

In the case where the silica aerogel fine particles are used as the aerogel fine particles for the filler (2), it is desirable that the refractive index of the silica aerogel fine particles is adjusted within the range of 1.008 to 1.18, and preferably 1.1 to 1.3 so as to ensure performances of the silica aerogel such as its transparency, etc.

In the case where the silica fine and hollow particles are used as the filler (2), it is desirable that the refractive index thereof is adjusted within the range of 1.2 to 1.35, and preferably 1.2 to 1.3.

In the case where the polymer fine and hollow particles are used as the filler (2), it is desirable that the refractive index thereof is adjusted within the range of 1.2 to 1.4, preferably 1.2 to 1.3.

As the filler (2) having the low refractive index as mentioned above, a filler having a particle diameter of 5 nm to 2 μm, and particularly 20 nm to 500 nm is preferable. When the filler composed of the fine and hollow particles is used, it is preferable that a thickness of the shells of the particles is 5 nm to 20 nm. When the particle diameter of the filler (2) is smaller, the effect of lowering the average refractive index of the composite thin film (4) (i.e., the refractive index of the composite thin film as a whole) becomes greater, and also the composite thin film (4) has more excellent transparency, with the result that the light discharge efficiency becomes higher. On the contrary, when the particle diameter of the filler is larger, the scattering effect within the composite thin film (4) becomes larger. As a result, the effect of suppressing the light guiding is improved to thereby enhance the light discharge efficiency. To achieve both of the above effects, it is preferable that the particle diameter of the filler (2) is within the above ranges. The particle diameter of the filler (2) may be suitably selected within the above ranges, in accordance with the refractive index of the binder (3) forming the composite thin film (4), the kind and a thickness of a light-emitting element, etc. In this regard, the particle diameter herein referred to means a primary particle diameter, and such particle diameter is measured by visual observation with a transmission electron microscope.

On the other hand, it is preferable that the binder (3) having a refractive index larger than that of the filler (2) is an organic polymer or a metal oxide which is produced from a binder-forming material contained in a transparent coating composition. There is no particular limit in selection of the kind of the binder (3), in so far as the binder (3) is the organic polymer, the metal oxide or the like as mentioned above, and has a refractive index higher than that of the filler (2). As a material preferable for the use as the binder-forming material, acrylic polymers such as methyl methacrylate, epoxy polymers, fluorine polymers, styrene polymers, etc. are given in the case where the binder is the organic polymer. The refractive index of the binder formed with using the organic polymer is usually 1.4 to 1.65, and preferably 1.45 to 1.6. As a material preferable for the use as the binder-forming material, silica, indium tin oxide, titania, silica/titania composite oxide, zirconia, etc. are given, in the case where the binder is the metal oxide. The refractive index of the binder formed using the metal oxide is usually 1.45 to 3.0, and preferably 1.45 to 2.5.

It is particularly desirable to select a binder-forming material in which the filler (2) sufficient disperse. Above all, it is most preferable to use, as the binder-forming material (3), SILICONE RESIN-M which is obtained by the condensation polymerization of a partially or fully hydrolyzed product of a tetra-functional hydrolyzable organosiloxane represented by $SiX_4$ (in which X is, for example, an alkoxyl group having 1 to 4 carbon atoms) as described above, in the case where the filler (2) is of a silica type. As described above, the SILICONE RESIN-M itself may have a hydrolyzable substituent, or may have no such substituent. The refractive index of the binder (3) formed from the SILICONE RESIN-M is usually 1.3 to 1.50, and preferably 1.3 to 1.45.

A ratio of the filler (2) and the binder (3) present in the composite thin film (4) varies depending on a ratio of their respective refractive indexes and a ratio of their densities. Preferably, a mass percentage of the filler (2) is 40 to 95 mass %. In this case, the average refractive index of the composite thin film (4) is generally 1.2 to 1.4, and preferably 1.20 to 1.35. When the percentage of the filler (2) having the low refractive index is lower than 40 mass %, the average refractive index of the composite thin film (4) becomes larger. When it is higher than 95 mass %, the strength of the composite thin film (4) and the adhesion of the composite film to the substrate (1) become lower. Thus, such a composite thin film may be insufficient for the practical use. Therefore, either of these cases is disadvantageous. It is noted that the average refractive index of the composite thin film referred to throughout the present description means a refractive index which is measured as explained in the Examples which will be described later.

To form the composite thin film (4) on a surface of the substrate (1), the filler (2) and the binder (3) are mixed into a solvent and dissolved and/or dispersed therein to prepare a liquid coating material composition. The coating material composition is applied to a surface of the substrate (1) and dried to remove the liquid. Thus, a film as the composite thin film (4) is left on the substrate (1). If needed, heating may be carried out during the above drying step. Further, if needed, the resultant film may be baked by a further heating treatment. The coating material composition may be applied by spin coating, dip coating, flow coating, roll coating, bar coating or any other suitable method. A suitable application method may be selected in accordance with a thickness of the composite thin film (4), a size and the kind of the substrate (1), etc.

According to the first aspect of the present invention, the average refractive index of the composite thin film formed as above is generally lower than the refractive index of the substrate, and for example, it is desirable that the average refractive index is lower 0.01 to 0.5, and preferably 0.05 to 0.3. The average refractive index of the composite thin film is generally 1.2 to 1.4, preferably 1.20 to 1.35, and more preferably 1.25 to 1.3. However, since the filler (2) diffuses light which passes through the composite thin film (4), it may be a little higher than the average refractive index of the composite thin film, and may be, for example, about 1.35 to about 1.45.

FIG. 1(b) is a conceptual sectional view of a surface light emitting device AA which comprises the composite thin film-holding substrate A shown in FIG. 1(a), and a light-emitting element (15) in the form of a thin film, provided on the side of the composite thin film (4), which side is opposite to the substrate (1) side of the composite thin film. In the shown embodiment, light emitted by the light-emitting element (15) passes through the composite thin film (4) and the substrate (1) and goes out of the surface of the substrate (1), as indicated by the arrows. The composite thin film (4) is a composite layer comprising the filler (2) having a lower refractive index, and the binder (3) having a higher refractive index, and it is preferable that the composite thin film (4) has an average refractive index lower than the refractive index of the substrate (1). The light is diffused at the interface between the light-emitting element (15) and the composite thin film (4) and within the composite thin film (4), and thus, the diffused light passes through the substrate (1). During such light passing, an incident angle of the light which enters the substrate (1) from the composite thin film (4) becomes smaller, so that it becomes possible to decrease a quantity of light reflected by the interface between the surface of the substrate (1) and its ambient air to thereby decrease a quantity of guided light within the substrate (1), and in a preferable embodiment, almost no light is guided within the substrate (1).

There may be light which is guided within the light-emitting element (15). Such light guiding can be lessened by the scattering of light at the interface between the light-emitting element (15) and the composite thin film (4), because this interface has less flatness due to the presence of the filler, as schematically shown in FIG. 1(b). Further, because the thickness of the light-emitting element (15) is in the order of submicron (for example, 0.05 to 1 μm) at most, the guided light very frequently strikes the interface between the light-emitting element (15) and the composite thin film (4), so that almost entire quantity of the guided light finally goes into the composite thin film (4). As is understood from the above, the composite thin film (4) provided on the substrate (1) makes it possible to suppress the light guiding and to improve the discharge efficiency of light out of the surface of the substrate (1).

The light discharge efficiency is improved, as the difference in refractive index between the filler (2) and the binder (3) in the composite thin film (4) becomes larger. Concretely, this difference is preferably at least 0.01, and more preferably at least 0.05. Further, it is preferable that the surface of the composite thin film (4) on which the light-emitting element (15) is disposed has roughness which is as large as possible, in so far as the light-emitting element (15) can be formed thereon.

It is noted that portions between the particles of the filler (2) in the composite thin film (4) are not necessarily fully filled with the binder (3), and such portions may include voids, which may be referred to as bubbles. The voids usually contain ambient gas (generally air), and therefore, the voids have a lower refractive index as well as the filler (2), or have a refractive index lower than that of the filler (2). Therefore, the voids in the portions between the particles of the filler (2) act substantially as the filler (2), which leads to the improvement on the light discharge efficiency. It is noted that the average refractive index of the composite thin film (4) as a whole is desirably lower than the refractive index of the substrate (1), however, it may be a little higher than the refractive index of the substrate (1).

Figure 2:
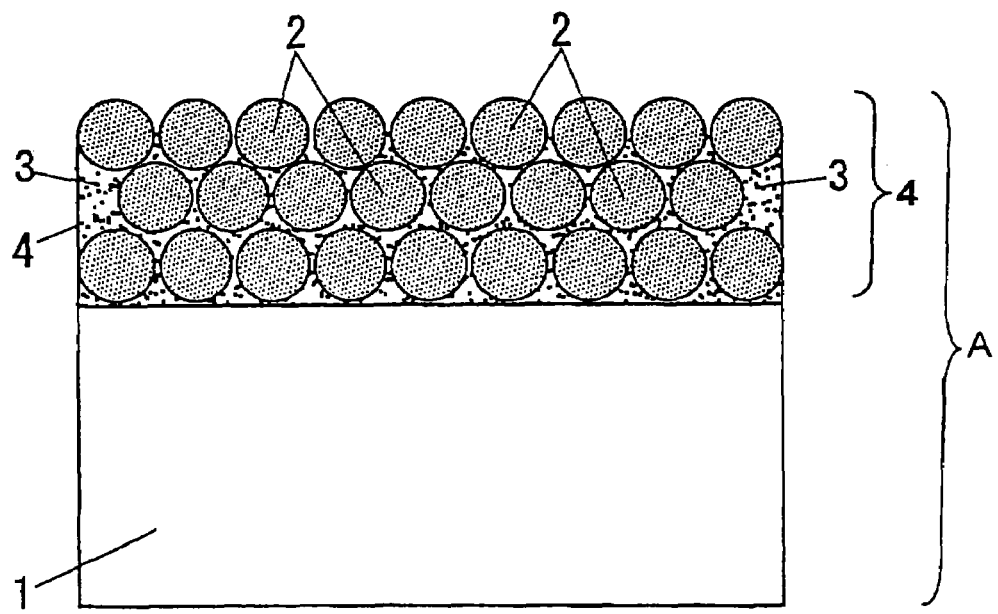
FIGS. 2(a) and 2(b) respectively illustrate examples of composite thin film-holding substrates according to another embodiment of the present invention, schematically showing the sectional views thereof, and a light-emitting element is provided in FIG. 2(b)
Figure 2:
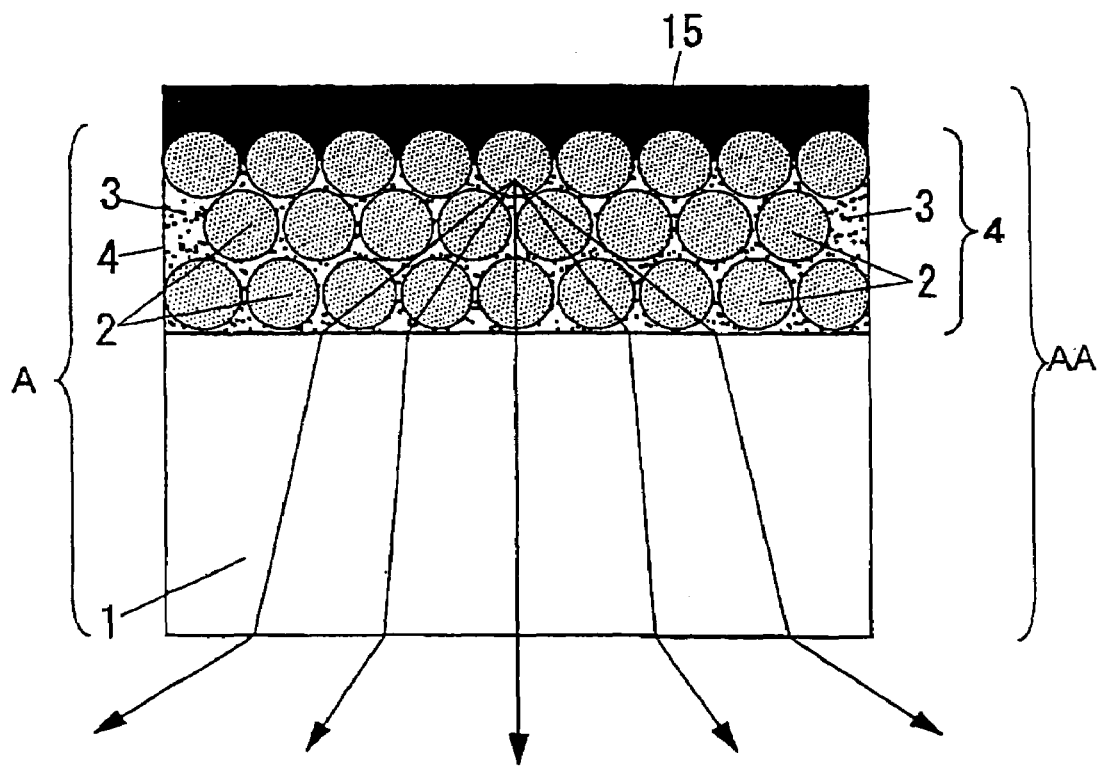

FIG. 2(a) is a schematic sectional view of an embodiment of a composite thin film-holding substrate A according to the second aspect of the present invention. In this embodiment, a composite thin film (4) comprising a filler (2) and a binder (3) is formed on a surface of a substrate (1). This composite thin film is obtained by applying and drying a coating material composition which is a mixture of the filler and a binder-forming material. In this embodiment, the refractive index of the binder (3) formed is lower than that of the substrate (1), and the refractive index of the filler (2) is higher than that of the binder (3).

There is no particular limit as to the binder (3) having a refractive index lower than that of the substrate (1), in so far as the binder (3) has a refractive index lower than that of the substrate (1) and also has a light-transmitting property. Silica porous materials, aerogels (for example, silica aerogel), etc. as described above are particularly preferable as the binder. To lower the average refractive index of the composite thin film (4), it is generally desirable that the refractive index of the binder (3) is lower than 1.3, and preferably lower than 1.25.

In the case where the silica porous material is used as the binder (3), it is preferable to select such a binder-forming material that allows the resultant binder to have a refractive index of preferably 1.2 to 1.45, and more preferably 1.2 to 1.35.

In the case where the aerogel is used as the binder (3), it is preferable to select such a binder-forming material that allows the resultant binder to have a refractive index of, preferably 1.005 to 1.3, and more preferably 1.1 to 1.3.

As the filler (2) having a higher refractive index than that of the binder (3), the fine particles of the metal oxides such as silica, titania and the like, the fine and hollow particles of the organic polymers such as silicone, etc. as described above may be used. The refractive index of the filler (2) is not particularly limited, in so far as it is higher than the refractive index of the binder (3). The refractive index of the filler (2) is generally at least 1.4, preferably at least 1.46, and more preferably at lest 1.5.

In the case where the fine particles of the metal oxide are used as the filler (2), it is preferable to select the fine particles of the metal oxide that allows the resultant filler to have a refractive index within a range of 1.46 to 3.0, and preferably 1.5 to 2.5.

In the case where the fine particles of the organic polymer are used as the filler (2), it is preferable to select such fine particles of the organic polymer that allow the resultant filler to have a refractive index within a range of 1.49 to 1.7, and preferably 1.5 to 1.67.

In the case where the fine and hollow silica particles are used as the filler (2), it is preferable to select the fine and hollow silica particles that allow the resultant filler to have a refractive index within a range of 1.3 to 1.4, and preferably 1.32 to 1.37.

It is preferable to use as the above described filler (2) the fine particles having a particle diameter of 5 nm to 2 µm, and particularly 20 nm to 500 nm. When the filler is in the form of the fine and hollow particles, a thickness of the shells thereof is preferably 5 nm to 20 nm. The effect of lowering the average refractive index of the composite thin film (4) (that is, the refractive index of a whole of the composite thin film) becomes higher, when a bulk specific gravity of the filler (2) becomes smaller, that is, when a percentage of the void within the particle becomes larger in the case of the fine and hollow particles. In addition, the transparency of the composite thin film (4) becomes higher when the particle diameter of the filler becomes smaller. As a result, the light discharge efficiency is improved. On the contrary, when the particle diameter of the filler becomes larger, the light-scattering effect within the composite thin film (4) becomes higher, to thereby effectively suppress the light guiding, which leads to the improvement on the light discharge efficiency. It is preferable that the particle diameter of the filler (2) should be within the above ranges in order for the composite thin film to have both of the above effects. Thus, the particle diameter of the filler is suitably selected within the above ranges, in accordance with a refractive index of the binder (3) forming the composite thin film (4), the kind and a thickness of the light-emitting element, etc.

The percentages of the binder (3) and the filler (2) present in the composite thin film (3) to be formed may vary in accordance with the refractive indexes and the densities of these materials, the average refractive index of the intended composite thin film, etc. Generally, the mass percentage of the binder (3) is 40 to 95 mass %, and that of the filler, 5 to 60 mass %. When the percentage of the binder (3) having the lower refractive index is lower than 40 mass %, the average refractive index of the composite thin film (4) becomes higher. On the contrary, when it is higher than 95 mass %, the strength of the composite thin film (4) becomes insufficient. Thus, both of the above cases may be disadvantageous since the objects of the present invention might not be achieved.

To form the composite thin film (4) on the surface of the substrate (1), a liquid coating material composition is prepared by mixing and dispersing the filler (2) and the binder-forming material in a solvent, and the resulting liquid coating material composition is applied on the surface of the substrate (1) to form an applied layer, which is then dried, and if necessary, it is baked by the heating treatment, as described above. In the case where the aerogel is used as the binder (3), the applied layer may be dried by the supercritical drying method as required.

According to the second aspect of the present invention, the average refractive index of the composite thin film thus formed as described above is generally lower than that of the substrate, and it is desirably, for example, 0.01 to 0.5, and preferably 0.05 to 0.3 lower than the refractive index of the substrate. The average refractive index of the composite thin film itself is generally 1.1 to 1.4, preferably 1.1 to 1.35, and more preferably 1.2 to 1.3.

FIG. 2(b) is a conceptual sectional view of a surface light emitting device AA which comprises the composite thin film-holding substrate A shown in FIG. 2(a), and a light-emitting element (15) in the form of a thin film, provided on the side of the composite thin film (4), which side is opposing to the substrate (1). In the shown embodiment, light emitted by the light-emitting element (15) passes through the composite thin film (4) and the substrate (1) and goes out of the surface of the substrate (1), as indicated by the arrows. The composite thin film (4) is a composite layer comprising the binder (3) having a lower refractive index, and the filler (2) having a higher refractive index, and the composite thin film (4) has an average refractive index lower than the refractive index of the substrate (1). The light passes through the interface between the light-emitting element (15) and the composite thin film (4) and through the composite thin film (4), and further through the substrate (1). During such light passing, an incident angle of the light enters the substrate (1) from the composite thin film (4) becomes smaller, because the refractive index of the composite thin film is lower than that of the substrate (1). As a result, it becomes possible to decrease a quantity of light which is reflected by the interface between the surface of the substrate (1) and its ambient air and to thereby decrease optical waveguide within the substrate (1), and in a preferable embodiment, almost no light is guided within the substrate (1).

There may be light which is guided within the light-emitting element (15). Such light guiding can be lessened by the scattering of light at the interface between the light-emitting element (15) and the composite thin film (4), because this interface has less flatness due to the presence of the filler, as schematically shown in FIG. 2(b). Further, because the thickness of the light-emitting element (15) is in the order of submicron (for example, 0.05 to 1 μm) at most, the guided light very frequently strikes the interface between the light-emitting element (15) and the composite thin film (4), so that almost entire quantity of light finally goes into the composite thin film (4). As is understood from the above, the composite thin film (4) provided on the substrate (1) makes it possible to suppress the light guiding and to improve the discharge efficiency light out of the surface of the substrate (1).

The difference in the refractive index between the filler (2) and the binder (3) in the composite thin film (4) is suitably designed. Specifically, this difference is preferably at least 0.01, and more preferably at least 0.1. Preferably, the surface of the composite thin film (4), on which the light-emitting element (15) is disposed, has a high flatness, and roughness of the surface of the composite thin film is designed based on the particle diameter and the amount of the filler. On the other hand, when the roughness of the surface of the composite thin film becomes larger, decrease of a quantity of light that is guided due to the diffusion at the interface can be expected, and the roughness is required to be within such range that the light-emitting element (15) can be formed as a continuous film.

It is noted that portions between the particles of the filler (2) in the composite thin film (4) are not necessarily fully filled with the binder (3), and such portions may include void, which may be referred to as bubbles. The voids usually contain ambient gas (generally air), and therefore, the voids have a low refractive index as well as the binder (3), or have a refractive index lower than that of the binder (3). Therefore, the voids in the portions between the particles of the filler (2) act substantially as the binder (3), which leads to the improvement on the light discharge efficiency. It is noted that the average refractive index of the composite thin film (4) as a whole is desirably lower than the refractive index of the substrate (1), however, it may be a little higher than the refractive index of the substrate (1).

Alternatively, as in the case of the composite thin film-holding substrate according to the third aspect of the present invention, it is also possible to form a composite thin film (4) having an average refractive index lower than the refractive index of a substrate (1), by using a binder (3) having a refractive index higher than that of the substrate (1) in combination with a filler (2) having a refractive index higher than that of the substrate (1). Although the composite thin film-holding substrate according to the third aspect is not shown, it would resemble the composite thin film-holding substrate shown in FIG. 2(a) as referred above, and thus, the composite thin film-holding substrate of this embodiment is described with reference to FIG. 2(a) for convenience.

In case of the composite thin film-holding substrate according to the third aspect, there is no particular limit in selection of the binder (3) having the refractive index higher than that of the substrate (1), in so far as the binder (3) has a refractive index higher than that of the substrate (1), and also has a light-transmitting property. As the binder (3), the organic polymers, the metal oxides, etc. as described above are preferably used. The refractive index of such binder is preferably within the range of 1.5 to 1.8, and more preferably within the range of 1.5 to 1.6. To form the composite thin film (4) having the refractive index lower than that of the substrate (1) by combining with the filler (2) having the refractive index higher than that of the substrate (1), it is needed that the composite thin film is formed while a mixing ratio of the binder is small such that the binder is inhibited from filling the voids in the portions between the fine particles of the filler in the composite thin film, and that bonding between the fine particles of the filler is facilitated.

For example, in the case where the organic polymer is used as the binder (3), it is preferable to select the binder-forming material which results in the binder having a refractive index of, for example, 1.5 to 1.7. In other case where the metal oxide is used as the binder (3), it is preferable to select the binder-forming material which results in the binder can have a refractive index of, for example, 1.5 to 1.8.

In the case where the composite thin film (4) which has a refractive index lower than that of the substrate (1) is formed in spite of using the binder (3) having a refractive index higher than that of the substrate (1) in combination with the filler having a refractive index higher than that of the substrate (1), the fine particles of the metal oxides such as silica, titania, etc., the fine particles of the organic polymers, etc. as described above can be used as the filler (2). The refractive index of this filler (2) is higher than that of the substrate (1), and it is generally at least 1.46.

In the case where the fine particles of the metal oxide are used as the filler (2), it is preferable to select the fine particles of the metal oxide such that the refractive index of the filler (2) is preferably within the range of 1.46 to 1.6, and more preferably within the range of 1.46 to 1.55. In the case where the fine particles of the organic polymer are used as the filler (2), it is preferable to select the fine particles of the organic polymer such that the refractive index of the filler (2) is preferably within the range of 1.49 to 1.65, and more preferably within the range of 1.49 to 1.6.

Preferably, the filler (2) has a particle diameter of 5 nm to 2 μm, and particularly 20 nm to 500 nm. When the fine and hollow particles are used as the filler, the thickness of the shells thereof is preferably 5 nm to 20 nm. The average refractive index of the composite thin film (4) (that is, the refractive index of the composite thin film as a whole) can be lowered, when a ratio of the binder/the filler in the solid content of the coating material composition becomes smaller, in other words, when a ratio of the binder which occupies the portions between the fine particles of the filler becomes smaller. Further, when the particle diameter of the filler becomes smaller, the composite thin film (4) can have higher transparency. As a result, the light discharge efficiency can be improved. On the other hand, when the particle diameter of the filler becomes larger, the light-scattering effect within the composite thin film (4) becomes larger to more effectively suppress the light guiding, with the result that the light discharge efficiency can be improved. To achieve both the effects, it is preferable that the particle diameter of the filler (2) is within the above ranges, and it is selected within such ranges in accordance with the refractive index of the binder (3) forming the composite thin film (4), the kind and a thickness of the light-emitting element, etc.

In the composite thin film (4) comprising the binder and the filler both of which have the higher refractive indexes than that of the substrate, a ratio of the binder (3) and the filler (2) may vary in accordance with the refractive indexes and the densities of the materials for them, the average refractive index of the intended composite thin film, etc. Generally, it is preferable that a mass ratio of the binder (3) is 5 to 20 mass %, and that of the filler (2) is 80 to 95 mass %.

When the composite thin film is formed using the binder and the filler each having a refractive index larger than that of the substrate, the binder acts only for bonding the particles of the filler as mentioned above, and it is needed that most of the portions between the particles of the filler are not occupied by the binder and left to be vacant. In such composite thin film, it is needed that a volume percentage of the filler in the composite thin film is 50 to 75%, and that a ratio of the vacant portions in the composite thin film is at least 25%.

When the mass percentage of the binder (3) having the higher refractive index is higher than 20 mass %, the binder tends to fill the portions between the fine particles of the filler, with the result that the average refractive index of the composite thin film (4) becomes higher. On the other hand, when it is higher than 95 mass %, the film strength of the composite thin film (4) becomes insufficient, and disadvantageously, the objects of the present invention may not be achieved. Thus, both the cases are sometimes undesirable.

It is also possible to provide a surface light emitting device which comprises the composite thin film-holding substrate of the third aspect and a light-emitting element (15) in the form of a thin film provided on the side of the composite thin film (4) which side is opposite to the side of the film on which the substrate (1) is located, in the same manner as in the embodiment shown in FIG. 2(b).

Figure 3:
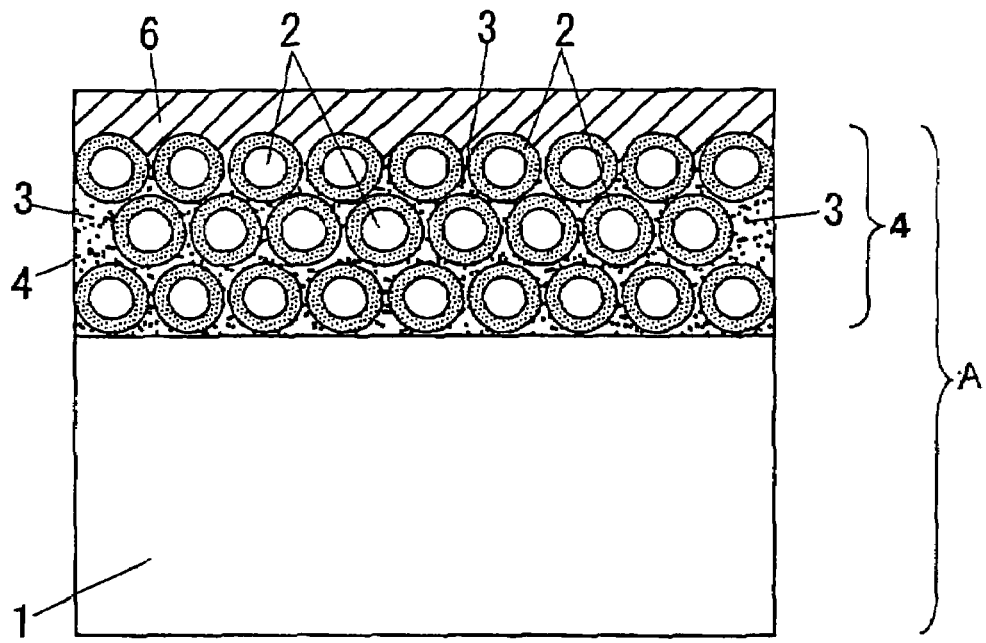
FIGS. 3(a) and 3(b) respectively illustrate in schematic sectional views composite thin film-holding substrates according to an embodiment of the present invention in which smoothening backing layers are provided on the composite thin film-holding substrates shown in FIGS. 1(a) and 2(a).
Figure 3:
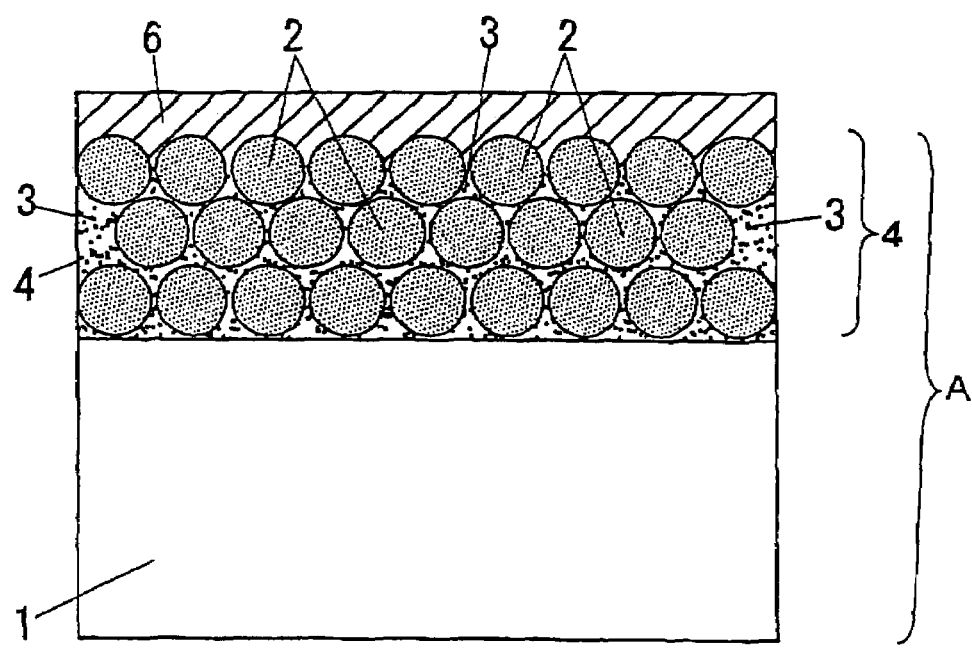

In each of the composite thin film-holding substrates A shown in FIGS. 1(a) and 2(a), a smoothening backing layer is provided on a surface of the composite thin film (4) which surface is opposite to the surface on which the substrate (1) is located (that is, a surface of the film (4) opposite the substrate (1)), when the roughness of the surface of the composite thin film (4) provided on the substrate (1) is too large. Thus, the irregularities of the surface of the composite thin film (4) are filled with the smoothening backing layer so as to smoothen the surface of the film. FIGS. 3(a) and 3(b) are schematic sectional views of the embodiments in which such smoothening backing layers (6) are provided on the composite thin film-holding substrates A shown in FIGS. 1(a) and 2(a), respectively. Thus, by providing such a smoothening backing layer (6), an organic electroluminescent element or the like which is required to have smoothness between thin films and a highly uniform thickness can be easily formed on the composite thin film (4).

Although there is no particular limit in selection of a material for the smoothening backing layer (6), it is preferable that such a material has a refractive index which is close the refractive index of a thin film or other layer to be formed on the backing layer (6). Specifically, metal oxides and metal nitrides such as silica, silicon nitride, alumina, aluminum nitride, titania and the like; fluorides such as magnesium fluoride, fluorine polymers and the like; acrylic polymers; epoxy polymers; parylenes; etc. can be used. The smoothening backing layer (6) can be formed by the vacuum deposition process, the sputtering process, the vapor phase growth process such as CVD, the coating process in which a volatile content of an applied layer formed on the composite thin film (4) is removed by drying, or the like.

A transparent and electrically conductive film may be formed on a surface of the composite thin film A formed as described above which surface is opposite to the surface on which the substrate is located. When the exposed surface of the composite thin film is not flat, the smoothening backing layer (6) is formed on the composite thin film as described above, and the transparent and electrically conductive film is formed thereon.

Figure 4:
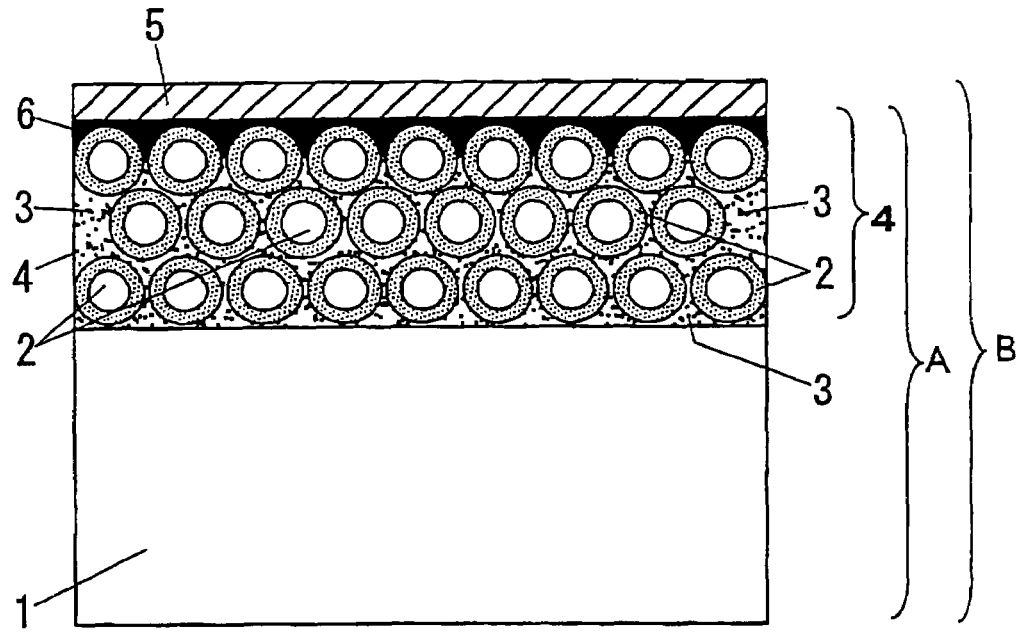
FIGS. 4(a) and 4(b) respectively illustrate in schematic sectional views composite thin film-holding substrates according to a further embodiment of the present invention in which transparent and electrically conductive films are provided on the composite thin film-holding substrates shown in FIGS. 3(a) and 3(b).
Figure 4:
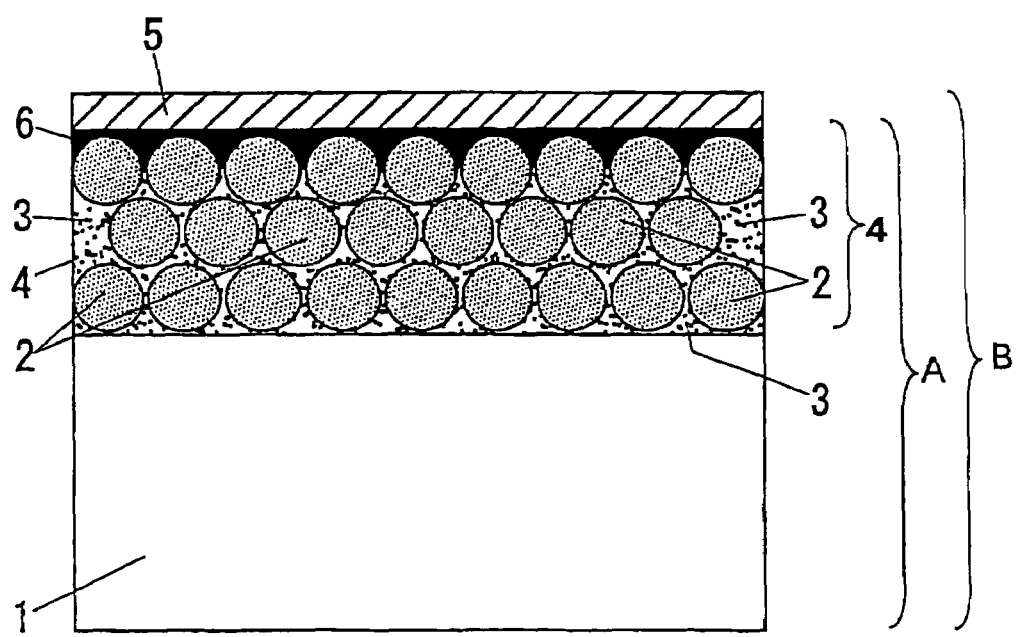

FIG. 4 shows schematic sectional views of the embodiments in which the transparent and electrically conductive films are formed as described above, respectively. Each of the embodiments shown in FIG. 4 is the transparent and electrically conductive film-holding substrate B which is provided by forming a transparent and electrically conductive film (5) on the composite thin film (4) of the composite thin film-holding substrate A formed as described above. Ii is noted that in each of these embodiments shown in FIG. 4, the smoothening backing layer (6) is provided on the surface of the composite thin film (4) opposite to the substrate (1), and the transparent and electrically conductive film (5) is formed on the smoothening backing layer (6). FIG. 4(a) shows a transparent and electrically conductive film-holding substrate in which the transparent conductive film (5) is provided on the composite thin film-holding substrate A shown in FIG. 3(a), and FIG. 4(b) shows a transparent and electrically conductive film-holding substrate in which the transparent conductive film (5) is provided on the composite thin film-holding substrate A shown in FIG. 3(b). The transparent and electrically conductive film (5) in the form of a thin film having a smooth surface and a highly uniform thickness can be easily formed by forming the transparent and electrically conductive film (5) on the smoothening backing layer (6) as described above.

The transparent and electrically conductive film (5) may be used as an anode (or a positive electrode) in the case where an electroluminescent element is formed, as will be described later. In such case, indium tin oxide (ITO), zinc oxide, tin oxide, indium zinc oxide (IZO), conductive polymers or the like can be used as a material for the transparent conductive film (5), although the material is not limited to those listed above. It is also optional to appropriately select a method for forming the transparent conductive film (5) such as the vapor phase growth process, the coating process or the like, as in the case of forming the smoothening backing layer (6).

In this regard, it is possible to form the transparent and electrically conductive film (5) having a smooth surface even on a backing layer of which smoothness is not sufficient, depending on the kind of the transparent and electrically conductive film (5) and the method for forming the same. In such case, it is not needed to provide the smoothening backing layer (6), and the transparent and electrically conductive film (5) may be directly formed on the composite thin film (4). This is applicable to for example a case where the transparent and electrically conductive film (5) is formed from an amorphous metal oxide such as IZO by the vapor phase growth process; or a case where the transparent conductive film (5) is formed from the conductive polymer or fine ITO particles by the coating process.

Figure 5:
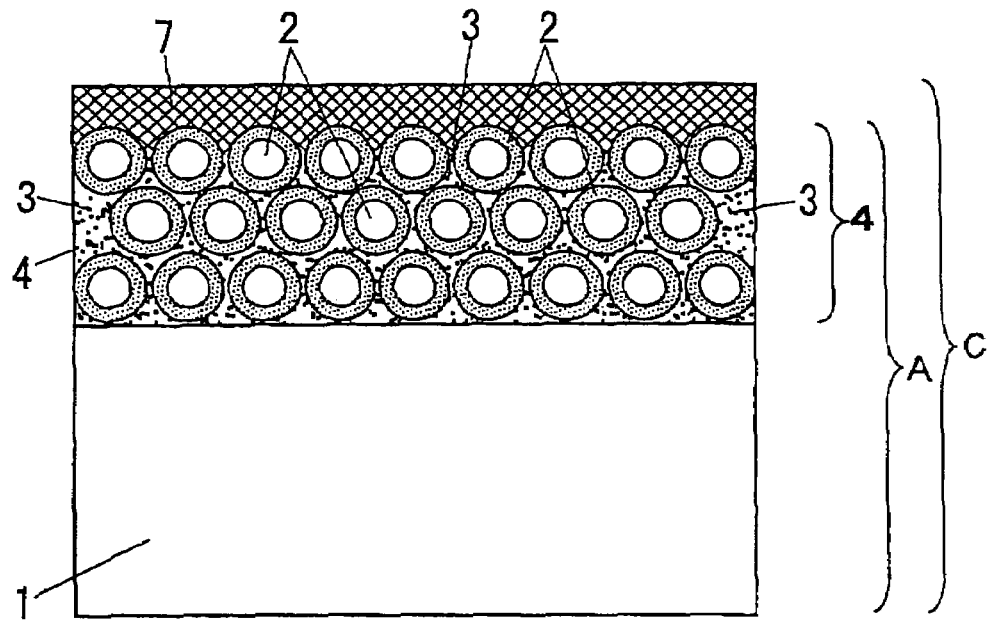
FIGS. 5(a) and 5(b) respectively illustrate in schematic sectional views composite thin film-holding substrates according to a further embodiment of the present invention in which fluorescent thin films are provided on the composite thin film-holding substrates shown in FIGS. 1(a) and 2(a).
Figure 5:
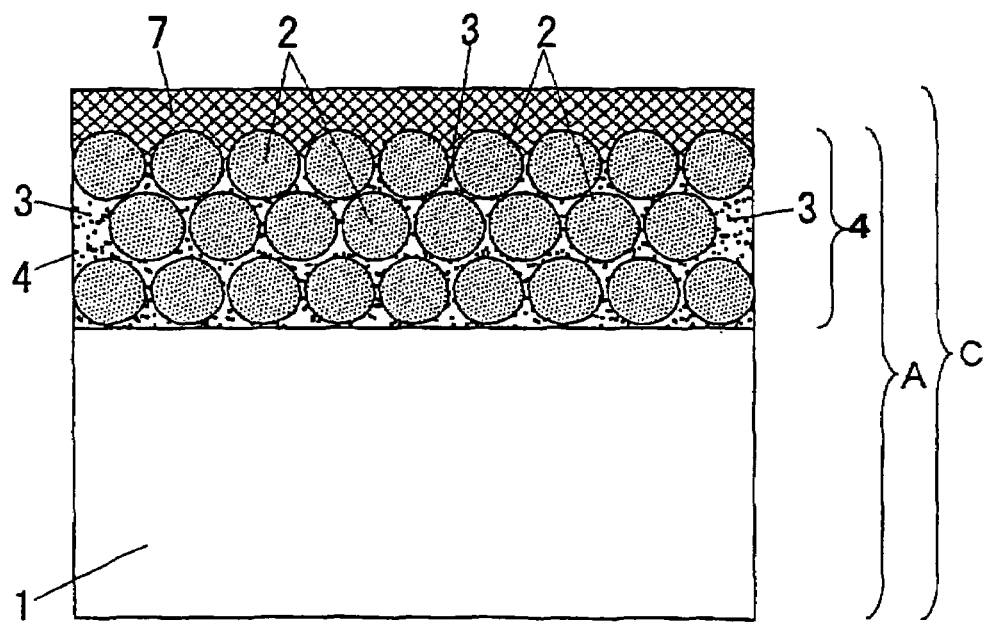

FIG. 5 shows schematic sectional views of surface light emitting device C in which thin films (7) of a fluorescent material are provided on the composite thin films (4) of the composite thin film-holding substrates A made as described above, respectively. In each of the embodiment shown in FIG. 5, the thin film (7) of the fluorescent material is directly provided on a surface of the composite thin film (4) opposite to the surface of the film (4) on which the substrate (1) is located. The thin film (7) comprises an organic or inorganic fluorescent material which is excited by irradiation with UV or an electron beam to thereby emit light, and the thin film as a photoluminescent element (7) composes a surface light emitting device (C). This surface light emitting device (C) is particularly useful for a self light-emitting display such as CRT, FED, PDP or the like. FIG. 5(a) shows a surface light emitting device in which the thin film (7) of the fluorescent material is provided on the composite thin film-holding substrate A shown in FIG. 1(a), and FIG. 5(b) shows a surface light emitting device in which the thin film (7) of the fluorescent material is provided on the composite thin film-holding substrate A shown in FIG. 2(a). The thin film (7) of the fluorescent material is formed in contact with the surface of the composite thin film (4), which improves the light discharge efficiency due to the presence of the filler (2).

There is no particular limit in selection of the fluorescent material, and any of organic or inorganic materials which are conventionally used for photoluminescent elements can be used. The fluorescent thin film (7) is formed by the vapor phase growth process such as the sputtering process, the MOCVD process (organic metal vapor phase growth process) or the like in case of using an inorganic fluorescent material; the film (7) is formed by the vacuum deposition process in case of using a low molecular weight organic fluorescent material; and the film (7) is formed by the coating process such as spin coating, ink jet coating or the like in case of using a high molecular weight organic fluorescent material.

Figure 6:
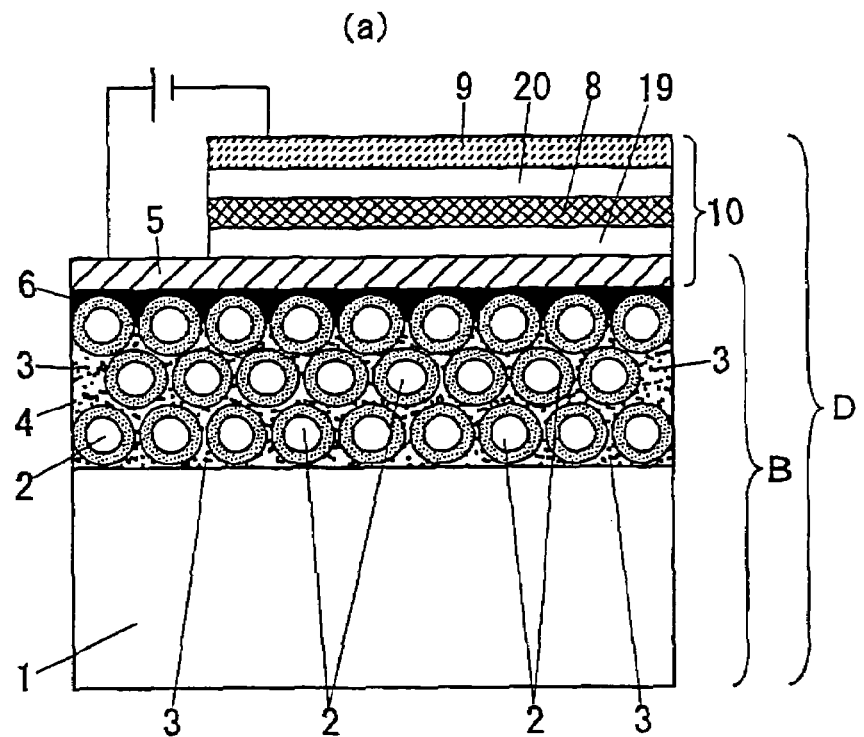
FIGS. 6(a) and 6(b) respectively illustrate in schematic sectional views composite thin film-holding substrates according to a further embodiment of the present invention in which electroluminescent elements are provided on the composite thin film-holding substrates shown in FIGS. 3(a) and 3(b).
Figure 6:
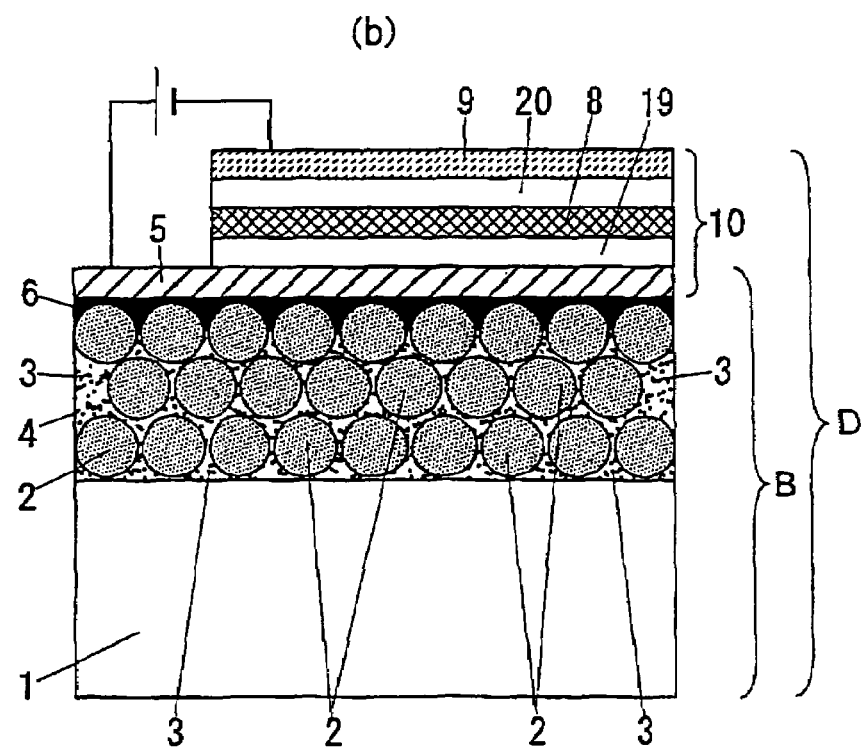
Figure 7:
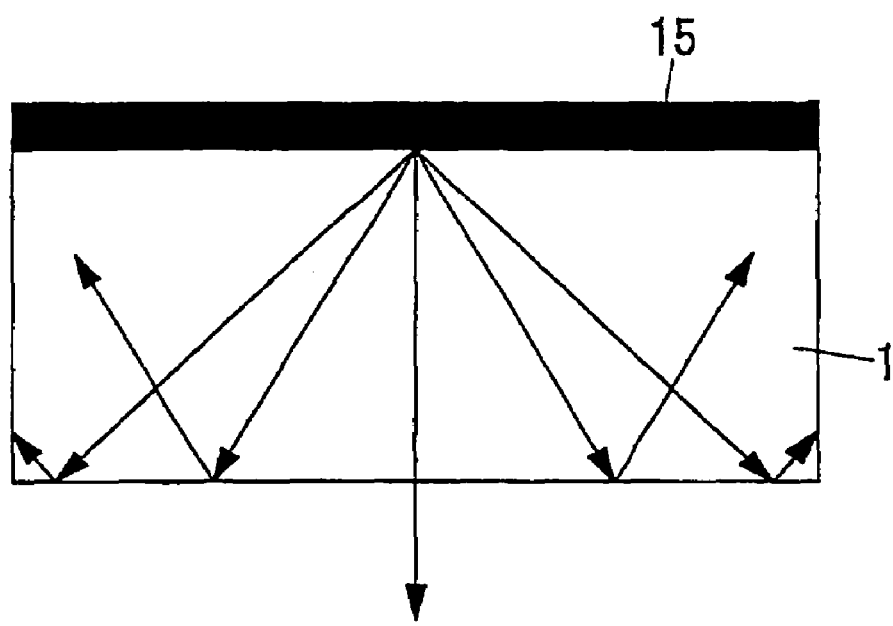
FIG. 7 is a sectional view of one example of light emitting device according to the prior art.
Figure 8:
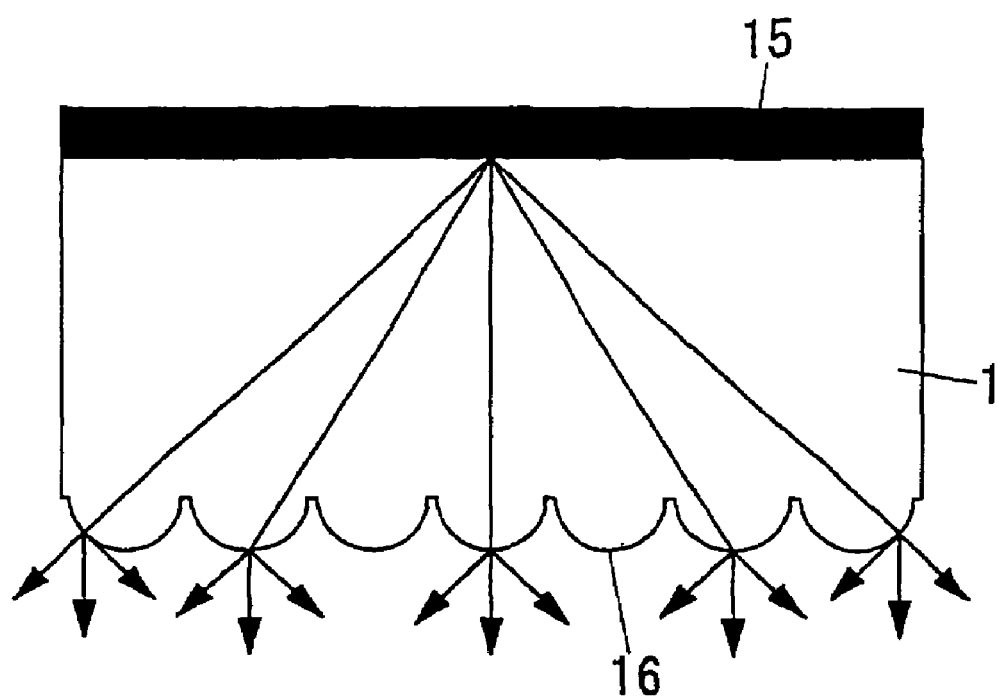
FIG. 8 is a sectional view of one example of another light emitting device according to the prior art.
Figure 9:
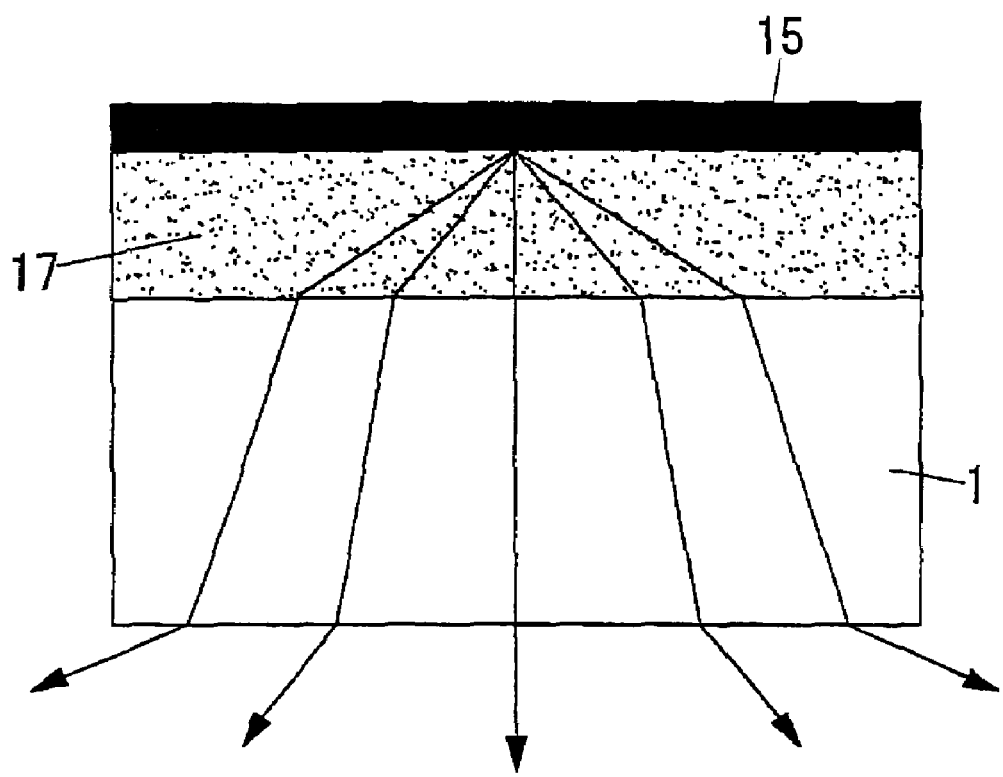
FIG. 9 is a sectional view of one example of a further light emitting device according to the prior art.

FIG. 6 shows schematic sectional views of a surface light emitting devices D in each of which a light-emitting layer (8) and a metal electrode (9) are stacked (or formed) on the transparent and electrically conductive film (5) of the above described transparent and electrically conductive film-holding substrate B to form an electroluminescent element (10). In other words, the element (10) is formed on the composite thin film-holding substrate A. The electroluminescent element (10) comprises the transparent and electrically conductive film (5) as an anode, the metal electrode (9) in the form of a thin metal film as a cathode (or negative electrode), and the light-emitting layer (8) formed between the anode and the cathode. Each of the embodiments shown in FIG. 6 represents an organic electroluminescent element (10) which includes, if needed, a hole-transporting layer (19) formed between the transparent and electrically conductive film (5) as the anode and the light-emitting layer (8), and an electron-transporting layer (20) formed between the light-emitting layer (8) and the metal electrode (9) as the cathode. In case of the inorganic electroluminescent element (10), the light-emitting layer (8) has dielectric layer(s) stacked on its one side or both sides. As materials for the light-emitting layer (8), the metal electrode (9), the hole-transporting layer (19) and the electron-transporting layer (20), the materials conventionally used in the production of the electroluminescent elements can be directly used.

It is noted that FIG. 6(a) shows a surface light emitting device in which the organic electroluminescent element (10) is provided on the transparent and electrically conductive substrate B shown in FIG. 4(a), and FIG. 6(b) shows a surface light emitting device in which the organic electroluminescent element (10) is provided on the transparent conductive substrate B shown in FIG. 4(b). The organic electroluminescent element (10) emits light as follows. When a positive voltage is applied to the transparent conductive film (5) as the anode, and a negative voltage is applied to the metal electrode (9) as the cathode, recombination of electrons injected into the light-emitting layer (8) through the electron-transporting layer (20) and holes injected into the light-emitting layer (8) through the hole-transporting layer (19) occurs in the light-emitting layer (8) to emit light.

EXAMPLES

Next, the present invention will be explained in more detail by way of Examples. In the Examples, the weight-average molecular weight was measured by gel permeation chromatography (or GPC), using HLC 8020 (manufactured by TOSOH CORPORATION) as a measuring device. Preparing a calibration curve using a standard polystyrene, measurements corresponding to the polystyrene were obtained.

Example 1

A solution was prepared by adding, to tetraethoxysilane (208 parts by mass), methanol (356 parts by mass), water (18 parts by mass) and 0.01N hydrochloric acid (18 parts by mass), and sufficiently mixing them with Disper. The resulting solution was stirred at 25° C. in a constant temperature bath for 2 hours to obtain a SILICONE RESIN-M (a product obtained by hydrolyzing tetraethoxysilane and condensation-polymerizing the hydrolyzed product) as a binder-forming material having a weight-average molecular weight of 850. To the SILICONE RESIN-M was added hollow silica IPA-dispersed sol (solid content: 20 mass %, dispersion medium: isopropylalcohol, average primary particle diameter: about 35 nm, and shell thickness: about 8 nm, manufactured by CATALYSIS & CHEMICALS INDUSTRIES CO., LTD.) as the fine and hollow silica particles so that a mass ratio of the fine and hollow silica particles/SILICONE RESIN-M (converted to the condensed compound) based on the solid contents was 80/20. The resulting mixture was diluted with methanol so that a whole of the solid contents was 10 mass %, and thereby a coating material composition was obtained which contained the fine and hollow silica particles. In this regard, the wording "converted to the condensed compound" means for example that the weight of Si present in the case of tetraalkoxysilane (i.e., tetraethoxysilane in this case) is calculated to be a weight of $SiO_2$, and that the weight of Si present in the case of trialkoxysilane is calculated to be a weight of $SiO_{1.5}$.

Next, the coating material composition was applied to a surface of a glass plate as a substrate with a spin coater at 1,000 rpm and dried to obtain a coating film. The coating film was baked at 200° C. for 10 minutes for the heating treatment so as to obtain a composite thin film-holding substrate having a structure as shown in FIG. 1(a). It is noted that the refractive index of the glass plate was 1.52, and that of the fine and hollow silica particles was 1.25, and that of the binder (which was obtained by applying SILICONE RESIN-M alone, and drying and thermally treating the same) was 1,45.

Example 2

To tetramethoxysilane (152 parts by mass) was added methanol (64 parts by mass), and the mixture was sufficiently stirred with Disper to obtain a solution of a binder-forming material for forming a silica aerogel binder. To this solution (216 parts by mass) were added methanol (64 parts by mass), water (36 parts by mass), 28 mass % of ammonia (0.6 parts by mass) and a 50-fold concentrated polystyrene fine particle-dispersed sol (solid content: 1 mass %, and average primary particle diameter: about 100 nm, manufactured by Duke Scientific), and the mixture was stirred to obtain a coating material composition which contained 10 mass % of the fine polystyrene particles in the mixture.

Next, the coating material composition was applied to a surface of a glass plate as a substrate with a spin coater at 1,000 rpm to form a coating film. After gelation of the coating film, it was dried under supercritical conditions of 80° C. and 160 kg/cm² to obtain a composite thin film-holding substrate having a structure as shown in FIG. 2(a). Ii is noted that the refractive index of the glass plate was 1.52; that of the fine polystyrene particles was 1.59; and that of the binder found after the supercritical drying was 1.18.

Comparative Example 1

A glass plate which was the same one as those used in Examples 1 and 2 was used as it was, without any treatment for the use as a substrate of Comparative Example 1.

Comparative Example 2

Only the SILICONE RESIN-M (therefore containing no fine and hollow silica particle) obtained in Example 1 was applied to a surface of a glass plate (which was the same those as those used in Examples 1 and 2) in the same manner as in Example 1, and the resulting film-holding substrate was referred to as Comparative Example 2.

As to the substrates obtained in Examples 1 and 2 and Comparative Examples 1 and 2, light transmissions and average refractive indexes of the composite thin films were measured. The light transmission measurement was carried out using a spectrophotometer ("U-3400" manufactured by Hitachi, Ltd.) with a wavelength of 550 nm. The average refractive index of the composite thin film was measured by observing a section of the substrate with a scanning electron microscope so as to measure a thickness of the composite thin film, and measuring the refractive index thereof with an ellipsometer ("EMS-1" manufactured by ULVAC). The results are shown in Table 1.

It is noted that pencil hardness of the composite thin films of the substrates obtained in Examples 1 and 2 were measured. The pencil hardness of the composite thin film of Example 1 was 2 H, and that of the composite thin film of Example 2 was 5 H. Such hardness was sufficient to handle the films in the practical use. The thin film which was formed of silica aerogel alone and which had a refractive index of as low as 1.2 had a pencil hardness softer than B, and thus it was very susceptible to damage and difficult to handle.

TABLE 1

| | Filler of composite thin film | Binder of composite thin film | Light transmission | Refractive index |
|---|---|---|---|---|
| Ex. 1 | Hollow silica | SILICONE RESIN-M | 96% | 1.30 |
| Ex. 2 | Polystyrene | Silica aerogel | 95% | 1.21 |
| Com. Ex. 1 | — | — | 91% | — |
| Com. Ex. 2 | — | SILICONE RESIN-M | 90% | 1.48 |

Example 3

Plasma CVD was carried out at 300° C. using tetraethoxysilane as a material source, so as to form a smoothening backing layer of a SiO₂ film with a thickness of 100 nm on the surface of the composite thin film of the composite thin film-holding substrate obtained in Example 1. Next, RF sputtering was carried out at 200° C., so as to form on the smoothening backing layer a transparent and electrically conductive film consisting of an ITO thin film with a thickness of 100 nm. Thus, a transparent and electrically conductive film-holding substrate as shown in FIG. 4(a) was obtained.

Example 4

Using the composite thin film-holding substrate of Example 2, plasma CVD was carried out at 300° C. with a SiH₄ gas and a N₂ gas as material sources, so as to form a smoothening backing layer consisting of an SiN film with a thickness of 100 nm on the surface of the composite thin film. Next, RF sputtering was carried out at 200° C., so as to form on the smoothening backing layer a transparent and electrically conductive film consisting of an IZO thin film with a thickness of 100 nm. Thus, a transparent conductive film-holding substrate as shown in FIG. 4(b) was obtained.

Comparative Example 3

A transparent and electrically conductive thin film consisting of an ITO thin film was directly formed as Comparative Example 3 on the surface of a glass plate which was the same as those used in Examples 1 and 2, in the same manner as in Example 3.

Comparative Example 4

A transparent and electrically conductive thin film consisting of an IZO thin film was directly formed as Comparative Example 4 on the surface of a glass plate which was the same as those used in Examples 1 and 2, in the same manner as in Example 4.

As to the transparent conductive film-holding substrates obtained in Examples 3 and 4 and Comparative Examples 3 and 4, a light transmission and a sheet resistance of the transparent and electrically conductive films were measured. The sheet resistance was measured with a Hall effect measuring apparatus ("HL5500" manufactured by Accent Optical Technology Co., Ltd.). The results are shown in Table 2.

TABLE 2

| | Composition of composite thin film | Transparent conductive film | Light transmission | Sheet resistance |
|---|---|---|---|---|
| Ex. 3 | Hollow silica/SILICONE RESIN-M | ITO | 83% | 21 Ω |
| Ex. 4 | Polystyrene/silica aerogel | IZO | 83% | 40 Ω |
| Com. Ex. 3 | — | ITO | 84% | 20 Ω |
| Com. Ex. 4 | — | IZO | 85% | 39 Ω |

Example 5

A film of aluminum tris(8-hydroquinoline) ("Alq3" manufactured by Doujindo Laboratories) with a thickness of 100 nm was formed as a thin film of a fluorescent material on the composite thin film of the composite thin film-holding substrate of Example 1. Thus, a surface light emitting device as shown in FIG. 5(a) was obtained as a photoluminescent element.

Example 6

A thin film of a fluorescent material was formed on the composite thin film of the composite thin film-holding substrate of Example 2 in the same manner as in Example 5. Thus, a surface light emitting device as shown in FIG. 5(b) was obtained as a photoluminescent element.

Comparative Example 5

A thin film of a fluorescent material was directly formed on the surface of a glass plate which was the same one as those used in Examples 1 and 2 in the same manner as in Example 5. Thus, a surface light emitting device as a photoluminescent element was obtained.

The fluorescent thin films of the surface light emitting device obtained in Examples 5 and 6 and Comparative Example 5 were irradiated with UV using a 20 W UV fluorescent lamp, and a luminance at a surface of each glass substrate was measured with a luminance meter ("LS-110" manufactured by MINOLTA CO., LTD.). The results are shown in Table 3.

TABLE 3

| | Composition of composite thin film | Fluorescent layer | Luminance of photoluminescence |
|---|---|---|---|
| Ex. 5 | Hollow silica/SILICONE RESIN-M | Alq3 | 4.2 cd/m$^2$ |
| Ex. 6 | Polystyrene/silica aerogel | Alq3 | 3.9 cd/m$^2$ |
| Com. Ex. 5 | — | Alq3 | 1.9 cd/m$^2$ |

Example 7

A film of N,N-diphenyl-N,N-bis-3-methylphenyl-1,1-diphenyl-4,4-diamine (α-NPD) with a thickness of 50 nm, a film of aluminum tris(8-hydroquinoline) (Alq3) with a thickness of 50 nm and a film of Al with a thickness of 10 nm were formed on the transparent and electrically conductive film of the transparent conductive film-holding substrate of Example 3 by the vacuum deposition process to thereby stack a hole-transporting layer, a light-emitting layer and a metal electrode. Thus, an organic electroluminescent element was formed, and thereby, a surface light emitting device as shown in FIG. 6(a) was obtained.

Example 8

An organic electroluminescent element was formed using the transparent and electrically conductive film-holding substrate of Example 4 in the same manner as in Example 7, and thus, a surface light emitting device as shown in FIG. 6(b) was obtained.

Comparative Example 6

An organic electroluminescent element was formed using the transparent and electrically conductive film-holding substrate of Comparative Example 3 in the same manner as in Example 7, and thus, a surface light emitting device was obtained.

Comparative Example 7

An organic electroluminescent element was formed using the transparent and electrically conductive film-holding substrate of Comparative Example 4 in the same manner as in Example 7, and thus, a surface light emitting device was obtained.

As to each of the surface light emitting device obtained in Examples 7 and 8 and Comparative Examples 6 and 7, a DC power source of 10 V was connected between the transparent and electrically conductive film and the metal electrode of the Al film to emit light, and the luminance at the surface of the glass substrate was measured with a luminance meter ("LS-110" manufactured by MINOLTA CO., LTD.). The results are shown in Table 4.

TABLE 4

| | Composition of composite thin film | Transparent conductive film | Luminance of organic electroluminescence |
|---|---|---|---|
| Ex. 7 | Hollow silica/SILICONE RESIN-M | ITO | 295 cd/m$^2$ |
| Ex. 8 | Polystyrene/silica aerogel | IZO | 305 cd/m$^2$ |
| Com. Ex. 6 | — | ITO | 150 cd/m$^2$ |
| Com. Ex. 7 | — | IZO | 145 cd/m$^2$ |

EFFECT OF THE INVENTION

In the composite thin film-holding substrate according to the first aspect of the present invention, due to the filler which has a refractive index lower than that of the substrate and which is contained in the surface of the substrate, a quantity of such component of light that is guided within the substrate can be lessened, and thereby, the light discharge efficiency can be improved. In the case where a composite thin film comprising a filler having a refractive index lower than that of the substrate and a binder having a refractive index higher than that of the filler is formed, a part of light is scattered while passing through the composite thin film comprising the filler and the binder which have different refractive indexes. Because of a synergetic effect of the above, light guided within the light-emitting element is lessened, and light which passes through the composite thin film can be taken out from the substrate to the external (ambient air) at an improved efficiency, when the light-emitting element is provided on the composite thin film of the substrate. This is similar in the composite thin film-holding substrate according to the second aspect of the present invention wherein the composite thin film comprising the binder having a refractive index lower than that of the substrate and the filler having a refractive index higher than that of the binder is formed on the surface of the substrate. This is similar in the composite thin film-holding substrate according to the third aspect of the present invention wherein the composite thin film comprising the binder having a refractive index higher than that of the substrate and the filler having a refractive index higher than that of the substrate is formed on the surface of the substrate.

In the composite thin film-holding substrate according to the first aspect, when the filler having a refractive index lower than that of the substrate is selected from the fine aerogel particles, the fine and hollow silica particles, and the fine and hollow polymer particles, and wherein the binder having a refractive index higher than that of the filler is selected from the organic polymers and the metal oxides, the effect of the composite thin film comprising a filler and a binder, i.e., the effect of increasing the light discharge efficiency can be improved.

In the composite thin film-holding substrate according to the second aspect, when the binder having a refractive index lower than that of the substrate is the aerogel and the filler having a refractive index higher than that of the binder is selected from the fine particles of the organic polymers and the metal oxides, the effect of the composite thin film comprising such a filler and such a binder, i.e., the effect of increasing the light discharge efficiency can be improved.

When the refractive index of the filler or the binder which is lower than the refractive index of the substrate is 1.35 or lower in any of the above composite thin film-holding substrates, the average refractive index of the composite thin film can be lowered, and thus, the light discharge efficiency can be further improved.

The transparent and electrically conductive film-holding substrate of the present invention provided by forming the transparent and electrically conductive film on the composite thin film of any of the foregoing composite thin film-holding substrates can have a higher efficiency of the light discharge to its external.

In the transparent conductive film-holding substrate of the present invention, when the smoothening backing layer is formed on the composite thin film, and the transparent and electrically conductive film is formed on the backing layer, the transparent and electrically conductive film can be formed as a thin film having a smooth surface and a highly uniform thickness, and also, the transparent and electrically conductive film-holding substrate can have a higher light discharge efficiency.

In the surface light emitting device of the present invention, the thin film of the organic or inorganic fluorescent material which is excited by UV or an electron beam to thereby emit light is formed on the composite thin film of the composite thin film-holding substrate, and therefor, such surface light emitting device can achieve a higher efficiency of the light discharge to its external.

In another surface light emitting device of the present invention, the electroluminescent element is formed by stacking the light-emitting layer and a metal electrode in thus listed order on the transparent and electrically conductive film of the transparent and electrically conductive film-holding substrate, and this surface light emitting device can achieve a higher efficiency of the light discharge to its external.

The invention claimed is:

1. A composite thin film-holding substrate which comprises a substrate and a composite thin film disposed on a surface of the substrate, wherein
the composite thin film comprises a filler and a binder, and wherein
a refractive index of the filler (Nf) is lower than a refractive index of the binder (Nb) and lower than a refractive index of the substrate (Ns).

2. The composite thin film holding-substrate according to claim 1, wherein the filler is selected from aerogel fine particles, silica fine and hollow particles, and polymer fine and hollow particles, and the binder is selected from organic polymers and metal oxides.

3. The composite thin film-holding substrate according to claim 2, wherein the refractive index of the composite thin film is not higher than 1.4.

4. The composite thin film-holding substrate according to claim 3, wherein the refractive index of the filler is not higher than 1.3.

5. A transparent and electrically conductive film-holding substrate comprising a transparent and electrically conductive film, wherein the transparent and electrically conductive film is formed on the composite thin film of the composite thin film-holding substrate according to claim 1.

6. The transparent conductive film-holding substrate according to claim 5, wherein the transparent and electrically conductive film is formed on a smoothening backing layer which is formed on the composite thin film.

7. A surface light emitting device, wherein a light emitting layer and a metal electrode are stacked in this order on the transparent and electrically conductive film of the transparent conductive film-holding substrate according to claim 5, and the transparent and electrically conductive film, the light emitting layer and the metal electrode form an electroluminescent element.

8. A composite thin film-holding substrate which comprises a substrate and a composite thin film disposed on a surface of the substrate, wherein
the composite thin film comprises a filler and a binder, and wherein
a refractive index of the binder (Nb) is lower than a refractive index of the filler (Nf) and lower than a refractive index of the substrate (Ns).

9. The composite thin film-holding substrate according to claim 8, wherein the binder comprises a silica porous material, and the filler is selected from organic polymer fine particles, metal compound fine particles, and silica fine and hollow particles.

10. The composite thin film-holding substrate according to claim 9, wherein the refractive index of the composite thin film is not higher than 1.4.

11. The composite thin film-holding substrate according to claim 10, wherein the refractive index of the binder is not higher than 1.5.

12. The composite thin film-holding substrate according to claim 9, wherein the composite thin film is formed by applying, to the substrate, a coating material composition which comprises silica fine and hollow particles and SILICONE RESIN-M, and drying the resulting applied film.

13. The composite thin film-holding substrate according to claim 12, wherein an average particle diameter of the fine and hollow silica particles is from 5 nm to 2 μm.

14. A transparent and electrically conductive film-holding substrate comprising a transparent and electrically conductive film, wherein the transparent and electrically conductive film is formed on the composite thin film of the composite thin film-holding substrate according to claim 8.

15. The transparent conductive film holding substrate according to claim 14, wherein the transparent and electrically conductive film is formed on a smoothening backing layer which is formed on the composite thin film.

16. A surface light emitting device, wherein a light emitting layer and a metal electrode are stacked in this order on the transparent and electrically conductive film of the transparent and electrically conductive film-holding substrate according to claim 14, and the transparent and electrically conductive film, the light emitting layer and the metal electrode form an electroluminescent element.

17. A transparent and electrically conductive film-holding substrate comprising:
   a composite thin film-holding substrate which comprises a substrate and a composite thin film disposed on a surface of the substrate,
   the composite thin film comprises a filler and a binder,
   both of a refractive index of the filler (Nf) and a refractive index of the binder (Nb) are higher than a refractive index of the substrate (Ns), and
   a transparent and electrically conductive film formed on the composite thin film.

18. The transparent conductive film holding substrate according to claim 17, wherein the transparent and electrically conductive film is formed on a smoothening backing layer which is formed on the composite thin film.

19. A surface light emitting device, wherein a light emitting layer and a metal electrode are stacked in this order on the transparent and electrically conductive film of the transparent and electrically conductive film-holding substrate according to claim 17, and the transparent and electrically conductive film, the light emitting layer and the metal electrode form an electroluminescent element.

20. The transparent and electrically conductive film-holding substrate according to claim 17, wherein the filler is selected from organic polymer fine particles and metal oxide fine particles, and the binder is selected from organic polymers and metal oxides.

21. The transparent and electrically conductive film-holding substrate according to claim 20, wherein the refractive index of the binder is not higher than 1.8.

22. A surface light emitting device comprising a thin film of a fluorescent material, wherein the thin film of the fluorescent material is formed on a composite thin film of a composite thin film-holding substrate, the composite thin film-holding substrate comprising a substrate and a composite thin film disposed on a surface of the substrate, wherein the composite thin film comprises a filler and a binder, the filler is selected from the group consisting of fine aerogel fine particles, silica fine and hollow particles, and polymer fine and hollow particles, and the binder is selected from the group consisting of organic polymers and metal oxides, and wherein a refractive index of the filler (Nf) is lower than a refractive index of the binder (Nb) lower than a refractive index of the substrate (Ns), and the thin film of the fluorescent material comprises an organic or inorganic fluorescent material which is excited by an ultraviolet ray or electron ray to emit light.

\* \* \* \* \*

UNITED STATES PATENT AND TRADEMARK OFFICE
CERTIFICATE OF CORRECTION

PATENT NO.        : 7,582,351 B2                                    Page 1 of 1
APPLICATION NO.   : 10/492534
DATED             : September 1, 2009
INVENTOR(S)       : Yokogawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 905 days.

Signed and Sealed this

Fourteenth Day of September, 2010

David J. Kappos
*Director of the United States Patent and Trademark Office*